US012653044B2

(12) United States Patent
Choi et al.

(10) Patent No.: US 12,653,044 B2
(45) Date of Patent: Jun. 9, 2026

(54) SEMICONDUCTOR PACKAGE HAVING METAL LINE SPACED PART FROM CAPACITOR ON SECOND SIDE OF PACKAGE SUBSTRATE

(71) Applicant: SAMSUNG ELECTRONICS CO., LTD., Suwon-si (KR)

(72) Inventors: Kwang-Chul Choi, Suwon-si (KR); Sang Hyun Lee, Suwon-si (KR); Un-Byoung Kang, Suwon-si (KR); Jung Hoon Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 426 days.

(21) Appl. No.: 18/303,380

(22) Filed: Apr. 19, 2023

(65) Prior Publication Data

US 2023/0420374 A1     Dec. 28, 2023

(30) Foreign Application Priority Data

Jun. 27, 2022     (KR) ........................ 10-2022-0077927

(51) Int. Cl.
*H10W 70/60*          (2026.01)
*H10W 70/685*        (2026.01)
*H10W 90/00*          (2026.01)
(52) U.S. Cl.
CPC ........ *H10W 70/611* (2026.01); *H10W 70/685* (2026.01); *H10W 90/00* (2026.01); *H10W 90/701* (2026.01)

(58) Field of Classification Search
CPC ........... H01L 23/5383; H01L 23/49816; H01L 25/16; H10W 70/611; H10W 70/685; H10W 90/00; H10W 90/701
See application file for complete search history.

(56) References Cited

U.S. PATENT DOCUMENTS

| | | | |
|---|---|---|---|
| 7,378,733 B1 * | 5/2008 | Hoang | .................. H01L 23/642 |
| | | | 257/E23.178 |
| 8,093,105 B2 | 1/2012 | Manepalli et al. | |
| 8,390,112 B2 | 3/2013 | Houle et al. | |
| 8,709,879 B2 | 4/2014 | Park et al. | |
| 9,728,479 B2 | 8/2017 | Chou | |
| 9,953,960 B2 | 4/2018 | Chou | |
| 10,366,965 B2 | 7/2019 | Kuo et al. | |
| 11,205,612 B2 | 12/2021 | Pan et al. | |

(Continued)

FOREIGN PATENT DOCUMENTS

KR     10-2022-0009534 A     1/2022

*Primary Examiner* — Michael Jung
(74) *Attorney, Agent, or Firm* — Wolf, Greenfield & Sacks, P.C.

(57)     ABSTRACT

A semiconductor package includes a package substrate having a first side and an opposite second side, a semiconductor chip on the first side of the package substrate, a capacitor on the second side of the package substrate, a plurality of connecting terminals on the second side of the package substrate, and a metal line within a trench in the package substrate. The trench extends in a first direction, and the metal line is between the capacitor and the plurality of connecting terminals. The metal line is spaced apart from the capacitor in a second direction that is transverse to the first direction, and a distance between the metal line and the capacitor is 100 μm or more and 1000 μm or less.

20 Claims, 25 Drawing Sheets

(56)　　　　　　　References Cited

U.S. PATENT DOCUMENTS

| | | | |
|---|---|---|---|
| 2018/0151530 A1* | 5/2018 | Chen | H01L 24/14 |
| 2020/0176387 A1* | 6/2020 | Yu | H01L 21/6835 |
| 2021/0193582 A1* | 6/2021 | Yu | H01L 23/5386 |
| 2022/0352089 A1* | 11/2022 | Liu | H01L 23/562 |

\* cited by examiner

SEMICONDUCTOR PACKAGE HAVING METAL LINE SPACED PART FROM CAPACITOR ON SECOND SIDE OF PACKAGE SUBSTRATE

CROSS-REFERENCE TO RELATED APPLICATION

This application claims priority under 35 U.S.C. 119 to Korean Patent Application No. 10-2022-0077927 filed on Jun. 27, 2022 in the Korean Intellectual Property Office, the contents of which are herein incorporated by reference in its entirety.

BACKGROUND

1. Field of the Disclosure

The present disclosure relates to semiconductor packages. More specifically, the present disclosure relates to semiconductor packages configured to reduce contamination of connecting terminals therein.

2. Description of the Related Art

A semiconductor package is a package in which an integrated circuit chip is implemented in a form suitable for use in an electronic product. In general, a semiconductor package typically mounts a semiconductor chip on a printed circuit board and electrically connects them, using bonding wires or bumps. It is desirable to improve the reliability of semiconductor packages and to reduce the size thereof.

Unfortunately, when underfill comes into contact with connecting terminals that connect a semiconductor package and an external board, the performance and reliability of the semiconductor package may deteriorate.

SUMMARY

Aspects of the present disclosure provide a semiconductor package capable of improving performance and reliability of a product.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor package comprising, a package substrate having a first side and an opposite second side, a semiconductor chip on the first side of the package substrate, a capacitor on the second side of the package substrate, a plurality of connecting terminals on the second side of the package substrate, and a metal line within a trench in the package substrate, wherein the trench extends in a first direction, wherein the metal line is between the capacitor and the plurality of connecting terminals, wherein the metal line is spaced apart from the capacitor in a second direction that is transverse to the first direction, and wherein a distance between the metal line and the capacitor is 100 μm or more and 1000 μm or less.

According to another aspect of the present disclosure, there is provided a semiconductor package comprising, a package substrate having a first side and an opposite second side, a semiconductor chip on the first side of the package substrate, a capacitor on the second side of the package substrate, wherein the capacitor has a rectangular shape in plan view, an underfill between the capacitor and the package substrate, a plurality of connecting terminals on the second side of the package substrate, and a plurality of metal lines within the package substrate, wherein the plurality of metal lines are in adjacent, spaced apart relationship and are between a first surface of the capacitor and the plurality of connecting terminals.

According to another aspect of the present disclosure, there is provided a semiconductor package comprising, a package substrate having a first side and an opposite second side, a plurality of pad patterns on the second side of the package substrate, a semiconductor chip on the first side of the package substrate, a capacitor on the second side of the package substrate, wherein the capacitor has a rectangular shape in plan view, an underfill between the capacitor and the package substrate, a plurality of connecting terminals on the second side of the package substrate, wherein each of the plurality of pad patterns is connected to a respective one of the plurality of connecting terminals; and a metal line within a trench in the package substrate, wherein the trench extends in a first direction, and wherein the metal line includes a metal film and a metal oxide film on the metal film, wherein the trench is between a first surface of the capacitor and the plurality of connecting terminals, wherein the metal line includes a first sub-line and a second sub-line spaced apart from each other in a second direction transverse to the first direction, wherein the underfill overlaps at least a part of the first sub-line, and does not overlap the second sub-line, wherein a bottom surface of the metal line and the second side of the package substrate are co-planar, and wherein a thickness of each of the plurality of pad patterns is the same as a thickness of the metal line.

BRIEF DESCRIPTION OF THE DRAWINGS

The above and other aspects and features of the present disclosure will become more apparent by describing in detail exemplary embodiments thereof with reference to the attached drawings, in which:

FIGS. 16 and 17 are exemplary cross-sectional views for explaining a semiconductor package according to some embodiments.

FIGS. 18 to 25 are diagrams for explaining the fabricating process of the semiconductor package having the cross section of FIG. 2.

DETAILED DESCRIPTION OF THE EMBODIMENTS

A semiconductor package according to exemplary embodiments will be described below with reference to FIGS. 1 to 17.

Figure 1:
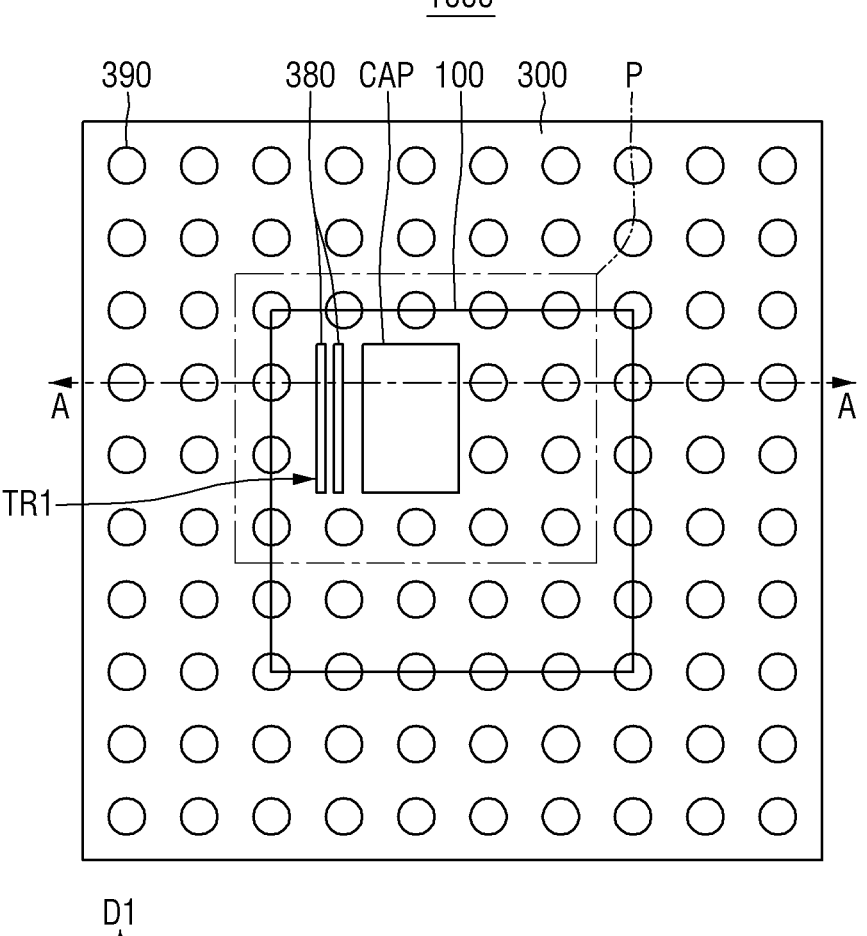
FIG. 1 is an exemplary plan view for explaining a semiconductor package according to some embodiments.
Figure 1:
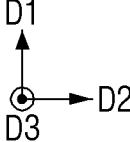
Figure 2:
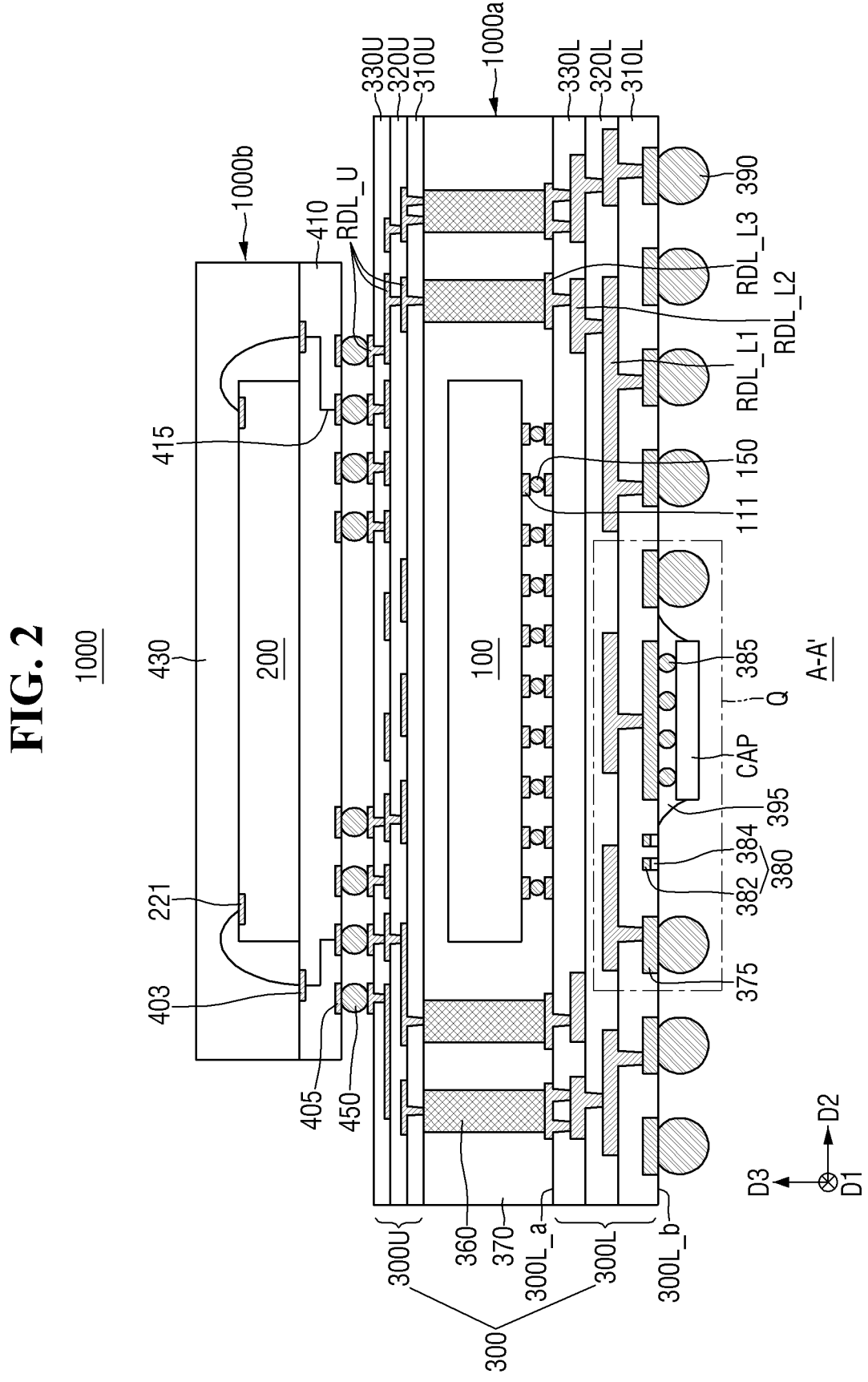
FIG. 2 is an exemplary cross-sectional view taken along a line A-A of FIG. 1.
Figure 3:
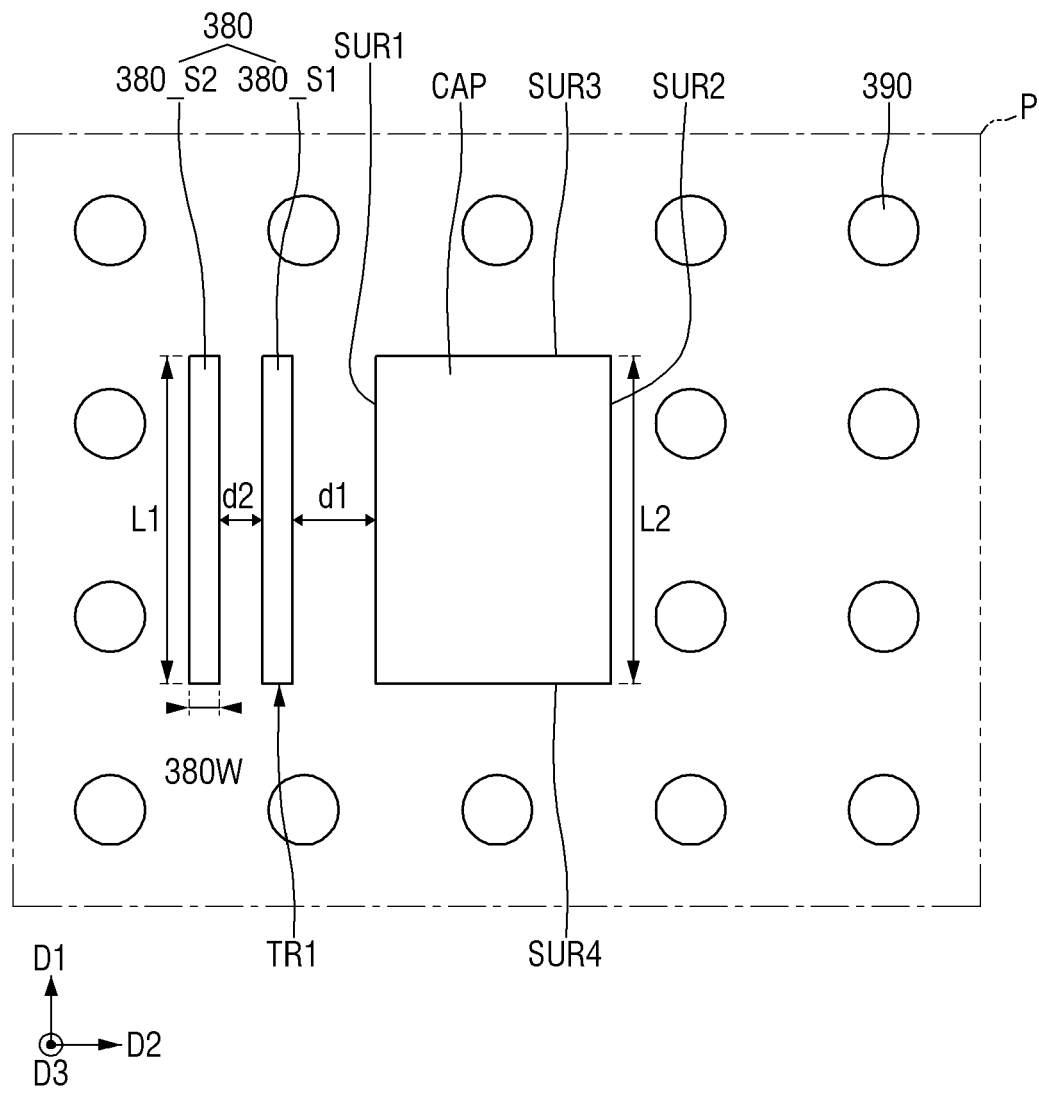
FIG. 3 is an enlarged view of a region P of FIG. 1.
Figure 4:
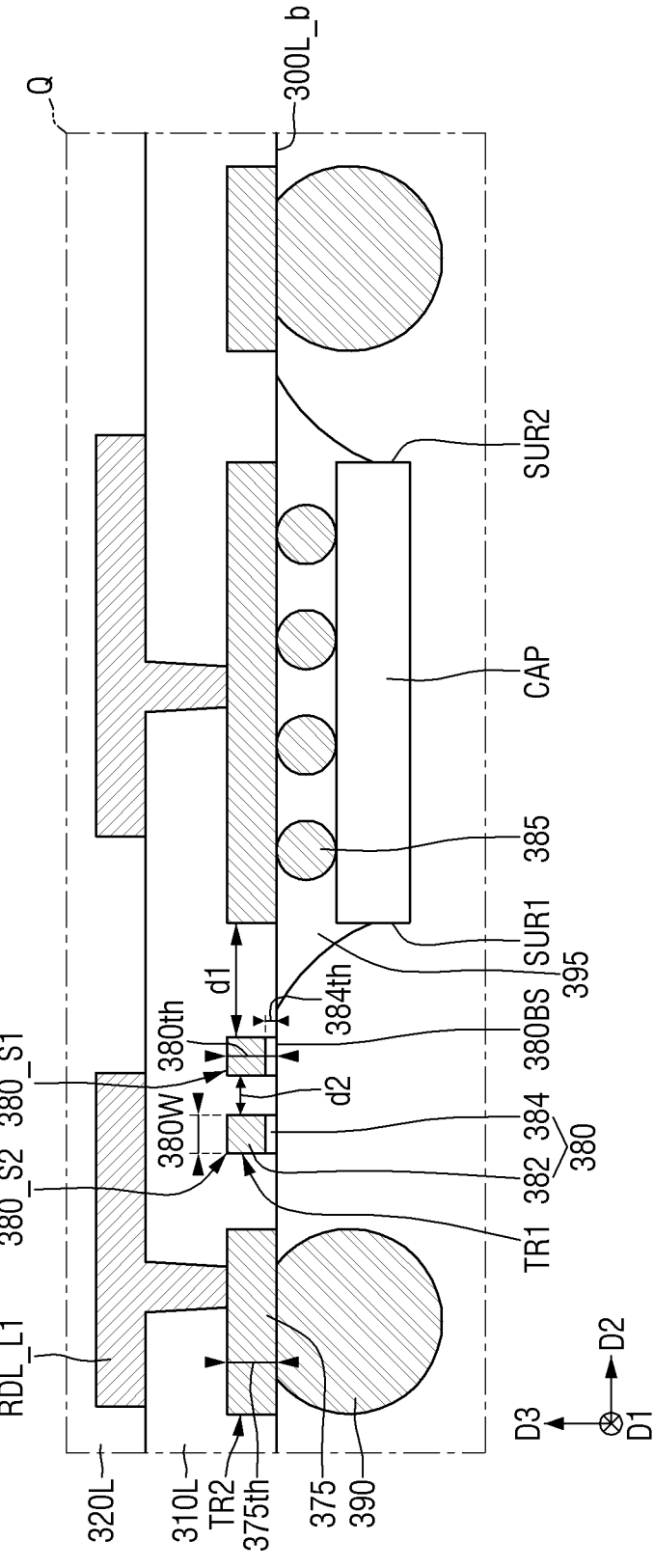
FIG. 4 is an enlarged view of a region Q of FIG. 2.

FIG. 1 is an exemplary plan view for explaining a semiconductor package according to some embodiments. FIG. 2 is an exemplary cross-sectional view taken along a line A-A of FIG. 1. FIG. 3 is an enlarged view of a region P of FIG. 1. FIG. 4 is an enlarged view of a region Q of FIG. 2.

First, referring to FIGS. 1 and 2, a semiconductor package 1000 according to some embodiments may include a first semiconductor package 1000a, and a second semiconductor package 1000b provided on the first semiconductor package 1000a.

The first semiconductor package 1000a may include a package substrate 300, a first semiconductor chip 100, a plurality of pad patterns 375, a capacitor CAP, a plurality of first connection members 385, an underfill 395, a plurality of connecting terminals 390, and at least one or more metal lines 380.

The package substrate 300 may include a lower package substrate 300L and an upper package substrate 300U. The lower package substrate 300L may be disposed below the first semiconductor chip 100. The upper package substrate 300U may be disposed on the first semiconductor chip 100.

For example, the lower package substrate 300L may include a first or front side 300L_a and a second or rear side 300L_b that are opposite to each other. The upper package substrate 300U and the first semiconductor chip 100 may be disposed on the front side 300L_a of the lower package substrate 300L. The capacitor CAP may be disposed on the rear side 300L_b of the lower package substrate 300L. A plurality of connecting terminals 390 may be disposed on the rear side 300L_b of the lower package substrate 300L. The front side 300L_a may face the first semiconductor chip 100. The rear side 300L_b may face the connecting terminal 390. The rear side 300L_b may face the capacitor CAP.

In FIG. 1, the plurality of connecting terminals 390 may be disposed around the capacitor CAP. The plurality of connecting terminals 390 may wrap around (i.e., are positioned around the periphery of) the capacitor CAP from when viewed in plan view. A metal line 380 may be disposed between the connecting terminal 390 and the capacitor CAP on a plane in which a first direction D1 and a second direction D2 extend. There may be at least one or more metal lines 380. The metal lines 380 may extend in the first direction D1. In this specification, the first direction D1, the second direction D2, and a third direction D3 may intersect each other. The third direction D3 may be a thickness direction of the package substrate 300. A detailed description of the metal line 380 will be provided below.

In FIG. 2, the lower package substrate 300L may include first to third lower insulating layers 310L, 320L and 330L. First to third lower redistribution patterns RDL_L1, RDL_L2 and RDL_L3, a plurality of pad patterns 375, and the metal lines 380 may be disposed inside the first to third lower insulating layers 310L, 320L and 330L.

As an example, a first lower insulating layer 310L may wrap a pad pattern 375. The pad pattern 375 may expose one surface of the first lower insulating layer 310L. The pad pattern 375 may expose the rear side 300L_b of the lower package substrate 300. The first lower insulating layer 310L may wrap the metal line 380. The metal line 380 may expose one surface of the first lower insulating layer 310L. The metal line 380 may expose the rear side 300L_b of the lower package substrate 300L. The first lower insulating layer 310L may wrap a via portion of the first lower redistribution pattern RDL_L1. A second lower insulating layer 320L may wrap a wiring portion of the first lower redistribution pattern RDL_L1. Also, the second lower insulating layer 320L may wrap the via portion of the second lower redistribution pattern RDL_L2. A third lower insulating layer 330L may wrap the wiring portion of the second lower redistribution pattern RDL_L2. The third lower insulating layer 330L may wrap the via portion of the third lower redistribution pattern RDL_L3. However, the technical idea of the present disclosure is not limited thereto.

Each of the first to third lower insulating layers 310L, 320L, and 330L may be made of a photoimageable dielectric. For example, the first to third lower insulating layers 310L, 320L, and 330L may include a photosensitive polymer. The photosensitive polymer may be formed of at least one of, for example, photosensitive polyimide, polybenzoxazole, phenolic polymer, and benzocyclobutene-based polymer. As another example, the first to third lower insulating layers 310L, 320L, and 330L may be formed of silicon oxide film, silicon nitride film or silicon oxynitride film.

Each of the first to third lower redistribution patterns RDL_L1, RDL_L2, and RDL_L3 may include a conductive material. For example, the first to third lower redistribution patterns RDL_L1, RDL_L2, and RDL_L3 may include, but are not limited to, copper (Cu).

In some embodiments, the lower package substrate 300L may include organics. For example, the lower package substrate 300L may include a pre-preg. The pre-preg is a composite fiber in which reinforcing fibers such as carbon fiber, glass fiber or aramid fiber are pre-impregnated with a thermosetting polymer binder (e.g., epoxy resin) or thermoplastic resin. In some embodiments, the lower package substrate 300L may include a copper clad laminate (CCL). For example, the lower package substrate 300L may have a structure in which a copper laminate is laminated on a single side or both sides of a thermoset pre-preg (e.g., pre-preg of C-stage).

A plurality of pad patterns 375 may be provided inside the lower package substrate 300L. The plurality of pad patterns 375 may be provided inside the first lower insulating layer 310L. The plurality of pad patterns 375 may expose the rear side 300L_b of the lower package substrate 300L. Bottom surfaces of each of the plurality of pad patterns 375 may be disposed on the same plane as (i.e., are co-planar with) the rear side 300L_b of the lower package substrate 300L. In some embodiments, some parts of the plurality of pad patterns 375 may be connected to the connecting terminals 390. Other parts of the plurality of pad patterns 375 may be connected to the capacitor CAP. However, the technical idea of the present disclosure is not limited thereto.

Each of the plurality of pad patterns 375 may include a conductive material. For example, the plurality of pad patterns 375 may include, but are not limited to, copper (Cu).

The plurality of connecting terminals 390 may be provided on the pad pattern 375. The connecting terminal 390 may be connected to the pad pattern 375. Although each of the plurality of connecting terminals 390 is shown as having a ball shape, the technical idea of the present disclosure is not limited thereto. Each of the plurality of connecting terminals 390 may have various shapes such as a land, a ball, a pin, and a pillar. The number, interval, placement form, and the like of the plurality of connecting terminals 390 are not limited to those shown in the drawings, and may vary depending on design. Each of the plurality of connecting terminals 390 may be, but is not limited to, a solder bump including low-melting point metals, for example, tin (Sn) and tin (Sn) alloys.

The capacitor CAP may be provided on the rear side 300L_b of the lower package substrate 300L. The capacitor CAP may be connected to the pad pattern 375. The capacitor CAP may include silicon (Si). As an example, the capacitor CAP may be, but is not limited to, a silicon (Si) capacitor.

Although the capacitor CAP is shown as being a single capacitor, the number of capacitors thereof is not limited thereto. The placement and number of capacitors CAP may vary depending on the design.

Although not shown, the semiconductor package 1000 according to some embodiments may further include a multi-layer ceramic capacitor (MLCC). The multi-layer ceramic capacitor may be disposed at a position adjacent to the capacitor CAP or may be disposed at a position spaced apart from the capacitor CAP.

A plurality of first connection members 385 may be provided between the pad pattern 375 and the capacitor CAP. The plurality of first connection members 385 may be connected to the pad pattern 375 and the capacitor CAP. The first semiconductor chip 100 and the capacitor CAP may be electrically connected through the plurality of first connection members 385. The plurality of first connection members 385 may be, but are not limited to, solder bumps including low-melting point metals, for example, tin (Sn) and tin (Sn) alloys. The plurality of first connecting members 385 may have various shapes such as a land, a ball, a pin, and a pillar. The plurality of first connection members 385 may be formed of a single layer or multiple layers. When the plurality of first connection members 385 are formed of a single layer, the plurality of first connection members 385 may include tin-silver (Sn—Ag) solder or copper (Cu) as an example. When the plurality of first connection members 385 are formed of multiple layers, the plurality of first connection members 385 may include copper (Cu) filler and solder as an example. The number, interval, placement form, and the like of the plurality of first connection members 385 are not limited to those shown, and may vary depending on design.

An underfill 395 may be formed between the lower package substrate 300L and the capacitor CAP. The underfill 395 may fill a space between the lower package substrate 300L and the capacitor CAP. The underfill 395 may wrap (i.e., surround or encase) the plurality of first connection members 385. In some embodiments, the underfill 395 may not completely cover the metal line 380. For example, the underfill 395 may not completely overlap the metal line 380 in the third direction D3.

The underfill 395 flows along the rear side 300L_b of the lower package substrate 300L after being discharged onto the rear side 300L_b of the lower package substrate 300L. The underfill 395 may flow between the lower package substrate 300L and the capacitor CAP to fill the space between the lower package substrate 300L and the capacitor CAP. The underfill 395 may not flow over the metal line 380. This may be due to a difference in physical properties between the rear side 300L_b of the lower package substrate 300L and the metal line 380. The wettability of the lower package substrate 300L and the wettability of the metal line 380 are different. Therefore, the underfill 395 may not completely cover the metal line 380. Because the underfill 395 does not flow over the metal line 380, the underfill 395 may not come into contact with the connecting terminal 390. The connecting terminal 390 may not be contaminated by the underfill 395. Therefore, a semiconductor package with improved reliability and performance can be fabricated. The underfill 395 may include, but is not limited to, an insulating polymeric material such as EMC (epoxy molding compound).

In an embodiment, the underfill 395 may be discharged after the connecting terminal 390 lands first. Since the underfill 395 does not flow over the metal line 380, the connecting terminal 390 may not be contaminated by the underfill 395. In another embodiment, the underfill 395 may be discharged first before the connecting terminal 390 lands. In this case, since the underfill 395 does not flow over the metal line 380, the pad pattern 375 may be prevented from being contaminated by the underfill 395. Therefore, a semiconductor package with improved reliability and performance can be fabricated.

The metal line 380 may be provided inside the lower package substrate 300L. The metal line 380 may include a metal film 382, and a metal oxide film 384 on the metal film 382. However, the technical idea of the present disclosure is not limited thereto. The metal line 380 may be formed of a single layer. The metal film 382 may include, for example, copper (Cu). The metal oxide film 384 may include, for example, copper oxide (CuO).

The metal line 380, the capacitor CAP, and the underfill 395 according to some embodiments will be described in more detail below with reference to FIGS. 3 and 4.

Referring to FIGS. 3 and 4, the capacitor CAP may have a rectangular shape when viewed in plan view. For example, the capacitor CAP may include first to fourth side surfaces SUR1, SUR2, SUR3, and SUR4 when viewed in plan view.

A first surface SUR1 and a second surface SUR2 may extend in the first direction D1. The first surface SUR1 and the second surface SUR2 may be opposite to each other. A third surface SUR3 may connect the first surface SUR1 and the second surface SUR2. The third surface SUR3 may extend in the second direction D2. A fourth surface SUR4 may connect the first surface SUR1 and the second surface SUR2. The fourth surface SUR4 may extend in the second direction D2. The third surface SUR3 and the fourth surface SUR4 may be opposite to each other.

In FIG. 3, although the lengths of each of the first surface SUR1 and the second surface SUR2 are shown as being longer than the lengths of the third surface SUR3 and the fourth surface SUR4, the technical idea of the present disclosure is not limited thereto. The lengths of the first surface SUR1 and the second surface SUR2 may be shorter than the lengths of the third surface SUR3 and the fourth surface SUR4, and the lengths of the first surface to the fourth surface SUR1, SUR2, SUR3, and SUR4 may all be the same.

In some embodiments, the metal line 380 may be provided on the first surface SUR1 of the capacitor CAP when viewed in plan view. The metal line 380 may not be provided on the second surface SUR2 of the capacitor CAP, the third surface SUR3 of the capacitor CAP, and the fourth surface SUR4 of the capacitor CAP when viewed in plan view. That is, the metal line 380 may be disposed on one surface of the capacitor CAP when viewed in plan view, and may not be disposed on the other surfaces.

In some embodiments, the metal line 380 may extend in the first direction D1. From a plan view, the metal line 380 may have, but is not limited to, an "I" shape (i.e., an elongate, rectangular shape). The first surface SUR1 of the capacitor CAP and the metal line 380 may be spaced apart from each other in the second direction D2. As an example, a spaced distance d1 between the first surface SUR1 of the capacitor CAP and the metal line 380 may be 100 μm or more and 1000 μm or less.

In some embodiments, the space between the metal line 380 and the capacitor CAP may be a region into which the underfill 395 is discharged. After the underfill 395 is discharged into the space between the metal line 380 and the capacitor CAP, the discharged underfill 395 may not flow over the metal line 380 toward the connecting terminal 390.

In some embodiments, the metal line 380 may include a first sub-line 380_S1 and a second sub-line 380_S2. Each of the first sub-line 380_S1 and the second sub-line 380_S2 may extend in the first direction D1. The first sub-line 380_S1 and the second sub-line 380_S2 may be spaced apart from each other in the second direction D2. A spaced distance d2 between the first sub-line 380_S1 and the second sub-line 380_S2 may be, but is not limited to, at least 10 μm or more. A width 380W of the metal line 380 in the second direction D2 may be at least 30 μm or more. A width 380W of each of the first sub-line 380_S1 and the second sub-line 380_S2 in the second direction D2 may be, but is not limited to, at least 30 μm or more.

The first sub-line 380_S1 may primarily control (i.e., contain or confine) the flow of the underfill 395. The second sub-line 380_S2 may secondarily control (i.e., contain or confine) the flow of the underfill 395. Since the metal line 380 includes the first sub-line 380_S1 and the second sub-line 380_S2, the flow of the underfill 395 can be more effectively controlled. This is because the second sub-line 380_S2 can further contain or confine any underfill that is not contained or confined by the first sub-line 380_S1.

In some embodiments, the length L1 of the metal line 380 in the first direction D1 may be the same as the length L2 of the capacitor CAP in the first direction D1. However, the technical idea of the present disclosure is not limited thereto, and the length L1 of the metal line 380 in the first direction D1 may be greater than the length L2 of the capacitor CAP in the first direction D1.

The metal line 380 may be disposed inside a first trench TR1. The pad pattern 375 may be disposed inside the second trench TR2. The first trench TR1 may extend in the first direction D1. The length of the first trench TR1 in the first direction D1 may be the same as the length L1 of the metal line 380 in the first direction D1. The width of the first trench TR1 in the second direction D2 may be the same as the width 380W of the metal line 380 in the second direction D2.

In some embodiments, a thickness 380*th* of the metal line 380 in the third direction D3 may be the same as a thickness 375*th* of the pad pattern 375 in the third direction D3. In other words, the depth of the first trench TR1 in the third direction D3 may be the same as the depth of the second trench TR2 in the third direction D3. The first trench TR1 and the second trench TR2 may be formed by the same process. Therefore, the depth of the first trench TR1 and the depth of the second trench TR2 may be the same.

A bottom surface 380BS of the metal line 380 may be disposed on the same plane as (i.e., is co-planar with) the rear side 300L_b of the lower package substrate 300L. A bottom surface of the pad pattern 375 may be disposed on the same plane as (i.e., is co-planar with) the rear side 300L_b of the lower package substrate 300L. The bottom surface 380BS of the metal line 380 may be disposed on the same plane as (i.e., is co-planar with) the bottom surface of the pad pattern 375.

The metal line 380 includes a metal film 382 and a metal oxide film 384 on the metal film 382. As an example, the metal film 382 may include copper (Cu) and the metal oxide film 384 may include copper oxide (CuO). A surface of the metal film 382 may be exposed in the process of forming the metal line 380. The exposed surface of the metal film 382 may be oxidized to form a metal oxide film 384. In some embodiments, a thickness 384*th* of the metal oxide film 384 in the third direction D3 may be, but is not limited to, 1000 Å or more.

In some embodiments, the underfill 395 may not cover the metal line 380. The underfill 395 may not overlap the metal line 380 in the third direction D3. The underfill 395 may not overlap the first sub-line 380_S1 in the third direction D3. The underfill 395 may not overlap the second sub-line 380_S2 in the third direction D3.

In some embodiments, a distance between the first surface SUR1 of the capacitor CAP and the connecting terminal 390 nearest to the first surface SUR1 of the capacitor CAP may be greater than a distance between the second surface SUR2 of the capacitor CAP and the connecting terminal 390 nearest to the second surface SUR2 of the capacitor CAP. A region between the first surface SUR1 of the capacitor CAP and the connecting terminal 390 nearest to the first surface SUR1 of the capacitor CAP may be a region into which the underfill 395 is discharged. The metal line 380 may be provided in the region between the first surface SUR1 of the capacitor CAP and the connecting terminal 390 nearest to the first surface SUR1 of the capacitor CAP.

Referring to FIG. 2 again, the semiconductor package 1000 according to some embodiments may further include a plurality of metal pillars 360, a molding film 370, a plurality of first chip pads 111, and a plurality of second connection members 150.

The first semiconductor chip 100 may be mounted on the front side 300L_a of the lower package substrate 300L. The first semiconductor chip 100 may be disposed in a central region of the lower package substrate 300L when viewed in plan view.

The first chip pads 111 may be provided on the lower surface of the first semiconductor chip 100. The lower surface of the first semiconductor chip 100 may be disposed to face the front side 300L_a of the lower package substrate 300L. The first chip pads 111 of the first semiconductor chip 100 may be connected to the third lower redistribution pattern RDL_L3.

The second connection members 150 may be attached between the first chip pads 111 of the first semiconductor chip 100 and the third lower redistribution pattern RDL_L3. The first semiconductor chip 100 and the connecting terminals 390 may be electrically connected through the second connection members 150. The second connection members 150 may be, but are not limited to, solder bumps including low-melting point metals, for example, tin (Sn) and tin (Sn) alloys. The second connecting members 150 may have various shapes such as a land, a ball, a pin, and a pillar. The second connection members 150 may be formed of a single layer or multiple layers. When the second connection members 150 are formed of a single layer, the second connection members 150 may include tin-silver (Sn—Ag) solder or copper (Cu) as an example. When the second connection members 150 are formed of multiple layers, the second connection members 150 may include copper (Cu) filler and solder as an example. The number, interval, placement form, and the like of the second connection members 150 are not limited to those shown in the drawings, and may vary depending on the design.

Metal pillars 360 may be provided around the first semiconductor chip 100. The metal pillars 360 may electrically connect the lower package substrate 300L and the upper package substrate 300U. The metal pillars 360 may penetrate through the molding film 370. The upper surfaces of the metal pillars 360 may form the same surface as the upper surface of the molding film 370. The lower surfaces of the metal pillars 360 may come into contact with the third lower redistribution patterns RDL_L3 of the lower package substrate 300L.

The molding film 370 may be provided between the lower package substrate 300L and the upper package substrate 300U. The molding film 370 may cover the first semiconductor chip 100. The molding film 370 may be provided on the front side 300L_a of the lower package substrate 300L. The molding film 370 may cover side walls and the upper surface of the first semiconductor chip 100. The molding film 370 may fill between the metal pillars 360. The thickness of the molding film 370 may be substantially the same as the thicknesses of the metal pillars 360. The molding film 370 may include an insulating polymer such as an epoxy-based molding compound.

The upper package substrate 300U includes first to third upper insulating layers 310U, 320U and 330U, and upper redistribution patterns RDL_U inside the first to third upper insulating layers 310U, 320U and 330U. The first to third upper insulating layers 310U, 320U and 330U may include the same material as that included in the first to third lower insulating layers 310L, 320L and 330L.

For example, each of the first to third upper insulating layers 310U, 320U, and 330U may be made up of a photoimageable dielectric. The first to third upper insulating layers 310U, 320U and 330U may include a photosensitive polymer. The photosensitive polymer may be formed from at least one of, for example, photosensitive polyimide, poly-benzoxazole, phenolic polymer, and benzocyclobutene-based polymer. As another example, the first to third upper insulating layers 310U, 320U and 330U may be formed of silicon oxide film, silicon nitride film or silicon oxynitride film.

The upper redistribution patterns RDL_U may include the same material as those of the first to third lower redistribution patterns RDL_L1, RDL_L2, and RDL_L3. For example, the upper redistribution patterns RDL_U may include, but is not limited to, copper (Cu).

A second semiconductor package 1000b may be disposed on the upper package substrate 300U. The second semiconductor package 1000b may include a circuit board 410, a second semiconductor chip 200, and an upper molding film 430. The circuit board 410 may be, but not limited to, a printed circuit board. A lower conductive pad 405 may be disposed on the lower surface of the circuit board 410.

A second semiconductor chip 200 may be disposed on the circuit board 410. The second semiconductor chip 200 may include integrated circuits. The integrated circuits may include a memory circuit, a logic circuit or a combination thereof. The second chip pads 221 of the second semiconductor chip 200 may be electrically connected to the upper conductive pad 403 on the upper surface of the circuit board 410 by wire bonding. The upper conductive pad 403 on the upper surface of the circuit board 410 may be electrically connected to the lower conductive pad 405 through an internal wiring 415 inside the circuit board 410.

An upper molding film 430 may be provided on the circuit board 410. The upper molding film 430 may cover the second semiconductor chip 200. The upper molding film 430 may include an insulating polymer such as an epoxy-based polymer.

The semiconductor package 1000 according to some embodiments may further include a plurality of third connection members 450. The third connection members 450 may be provided between the lower conductive pad 405 of the circuit board 410 and the upper redistribution pattern RLD_U. The third connection members 450 may be, but not limited to, solder bumps including low-melting point metals, for example, tin (Sn) and tin (Sn) alloys. The third connecting members 450 may have various shapes such as a land, a ball, a pin, and a pillar. The third connection members 450 may be formed of a single layer or multiple layers. When the third connection members 450 are formed of a single layer, the third connection members 450 may include, for example, tin-silver (Sn—Ag) solder or copper (Cu). When the third connection members 450 are formed of multiple layers, the third connection member 450 may include copper (Cu) filler and solder as an example. The number, interval, placement form and the like of the third connection members 450 are not limited to those shown in the drawings, and may vary depending on the design.

FIGS. 5 to 13 are exemplary plan views for explaining a semiconductor package according to some embodiments. Various embodiments of the semiconductor packages will be described below with reference to FIGS. 5 to 13.

Figure 5:
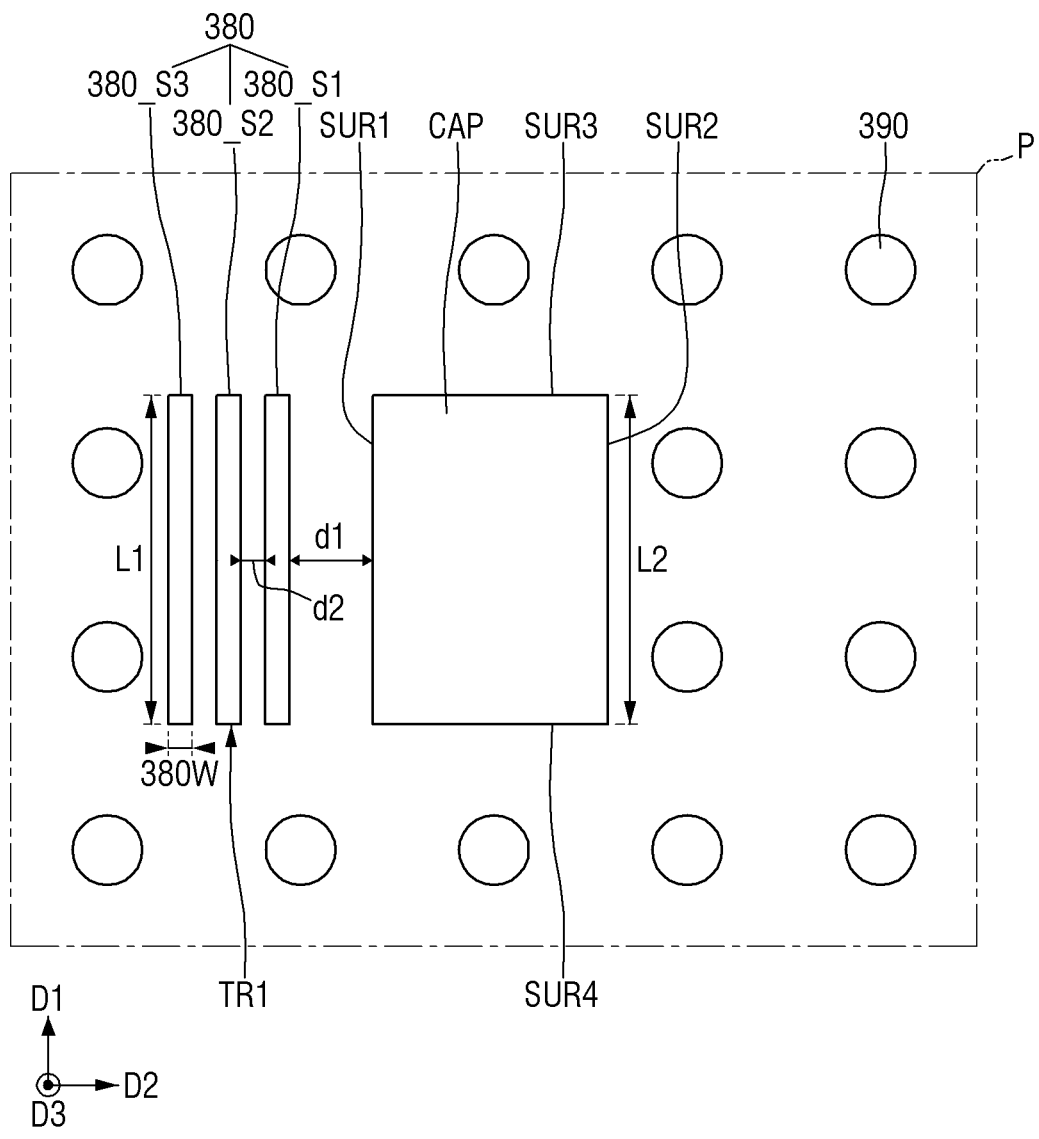
FIGS. 5 to 13 are exemplary plan views for explaining a semiconductor package according to some embodiments.

Referring to FIG. 5 first, the metal line 380 may further include a third sub-line 380_S3.

The third sub-line 380_S3 may be spaced apart from the second sub-line 380_S2 in the second direction D2. The first to third sub-lines 380_S1, 380_S2 and 380_S3 may be arranged sequentially away from the first surface SUR1 of the capacitor CAP, as illustrated in FIG. 5. A spaced distance in the second direction D2 between the first sub-line 380_S1 and the capacitor CAP may be smaller than a spaced distance in the second direction D2 between the third sub-line 380_S3 and the capacitor CAP.

A spaced distance in the second direction D2 between the second sub-line 380_S2 and the third sub-line 380_S3 may be the same as a spaced distance d2 in the second direction D2 between the first sub-line 380_S1 and the second sub-line 380_S2. For example, the spaced distance in the second direction D2 between the second sub-line 380_S2 and the third sub-line 380_S3 may be, but is not limited to, at least 10 μm or more.

In another embodiment, the spaced distance in the second direction D2 between the second sub-line 380_S2 and the third sub-line 380_S3 may be different from the spaced distance d2 in the second direction D2 between the first sub-line 380_S1 and the second sub-line 380_S2. The spaced distance between the first to third sub-lines 380_S1, 380_S2, and 380_S3 may vary depending on design.

Since the metal line 380 according to some embodiments further includes a third sub-line 380_S3, the metal line 380 may more effectively control (i.e., contain or confine) the flow of the underfill 395. This is because the third sub-line 380_S3 can further contain or confine any underfill that is not contained or confined by the first sub-line 380_S1 and the second sub-line 380_S2.

Figure 6:
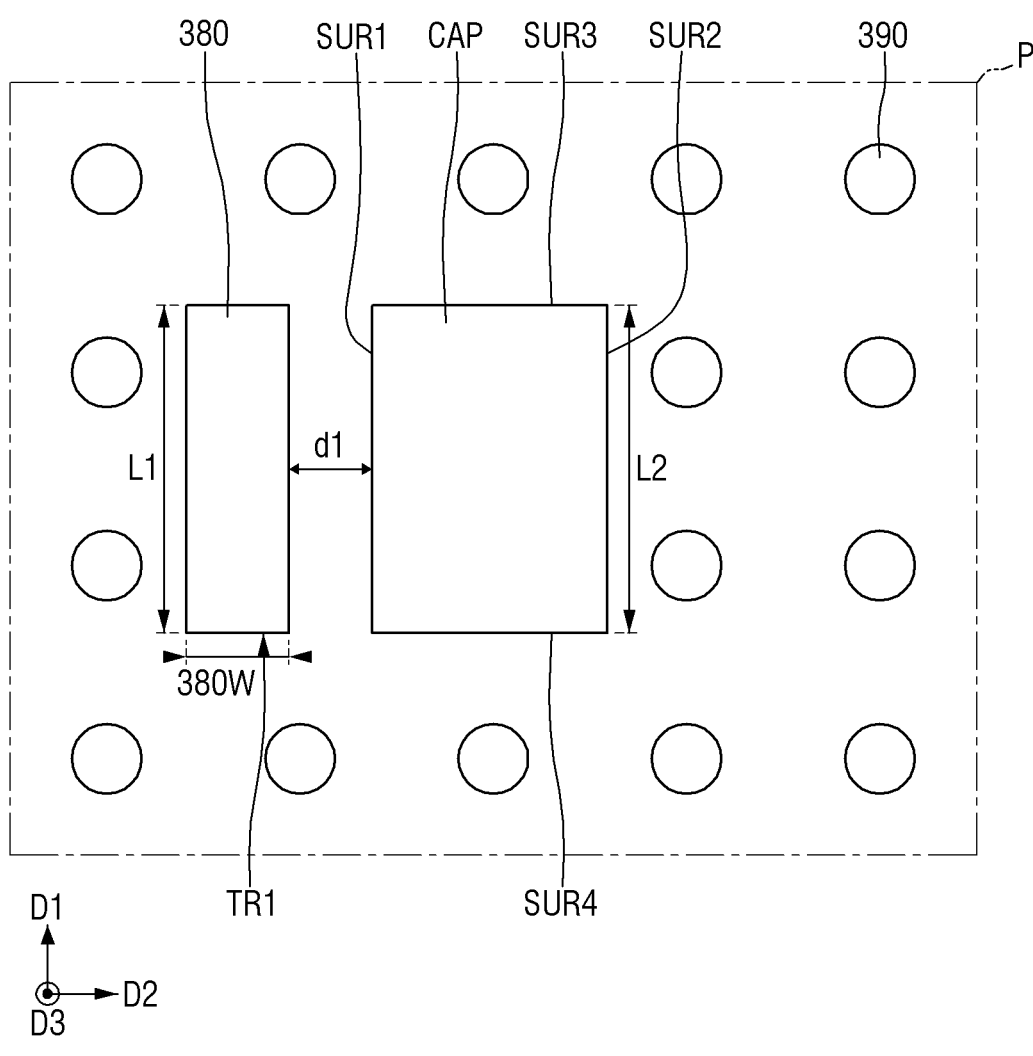

Referring to FIG. 6, the metal line 380 may not include sub-lines. Only one metal line 380 may be disposed.

Also in this case, the spaced distance d1 between the metal line 380 and the first surface SUR1 of the capacitor CAP may be 100 μm or more and 1000 μm or less. The width 380W of the metal line 380 in the first direction 380W may be, but not limited to, at least 30 μm or more.

Figure 7:
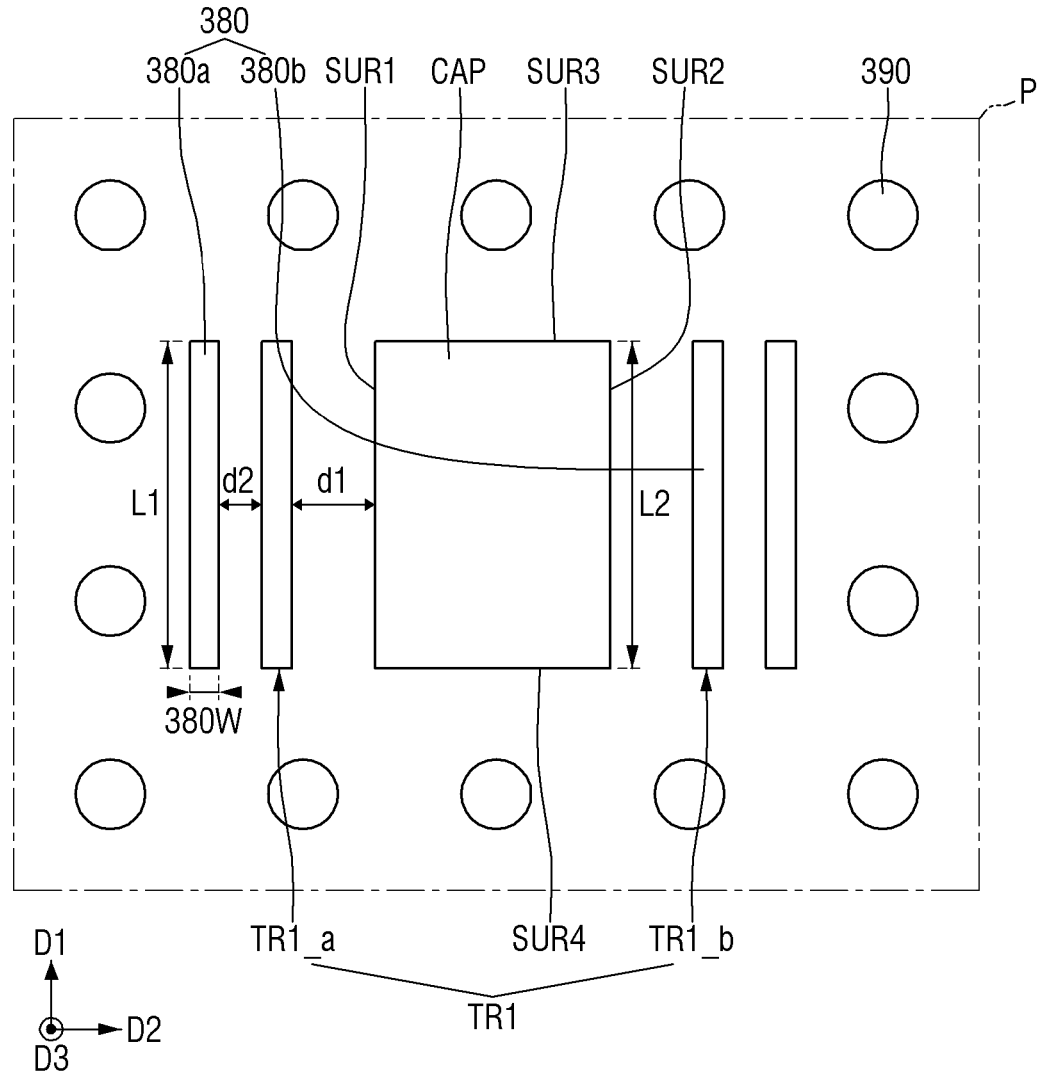

Referring to FIG. 7, the metal line 380 may include a first portion 380a and a second portion 380b.

The first portion 380a of the metal line 380 may be provided adjacent to the first surface SUR1 of the capacitor CAP. The second portion 380b of the metal line 380 may be provided adjacent to the second surface SUR2 of the capacitor CAP. The first portion 380a of the metal line 380 and the second portion 380b of the metal line 380 may be symmetrical with each other around the capacitor CAP.

In some embodiments, the first portion 380a and the second portion 380b of the metal line 380 may each include a first sub-line and a second sub-line. A spaced distance d2 between the first sub-line and the second sub-line of the first portion 380a of the metal line 380 may be at least 10 μm or more. A spaced distance d2 between the first sub-line and the second sub-line of the second portion 380b of the metal line 380 may be at least 10 μm or more. A width 380W of the first portion 380a of the metal line 380 in the second direction D2 may be at least 30 μm or more. A width 380W of the second portion 380b of the metal line 380 in the second direction D2 may be at least 30 μm or more. However, the technical idea of the present disclosure is not limited thereto.

The spaced distance d1 between the first surface SUR1 of the capacitor CAP and the first portion 380a of the metal line 380 may be 100 μm or more and to 1000 μm or less. Similarly, the spaced distance d1 between the second surface SUR2 of the capacitor CAP and the second portion 380b of the metal line 380 may be 100 μm or more and 1000 μm or less.

In some embodiments, the first trench TR1 may include a first portion TR1_a and a second portion TR1_b. The first portion TR1_a of the first trench TR1 may be formed adjacent to the first surface SUR1 of the capacitor CAP. The second portion TR1_b of the first trench TR1 may be formed adjacent to the second surface SUR2 of the capacitor CAP. The first portion 380a of the metal line 380 may be disposed inside the first portion TR1_a of the first trench TR1. The second portion 380b of the metal line 380 may be disposed inside the second portion TR1_b of the first trench TR1.

Since the metal line 380 according to some embodiments further includes the second portion 380b, it is possible to more effectively control the flow of the underfill 395 from the second surface SUR2 of the capacitor CAP toward the connecting terminal 390.

Figure 8:
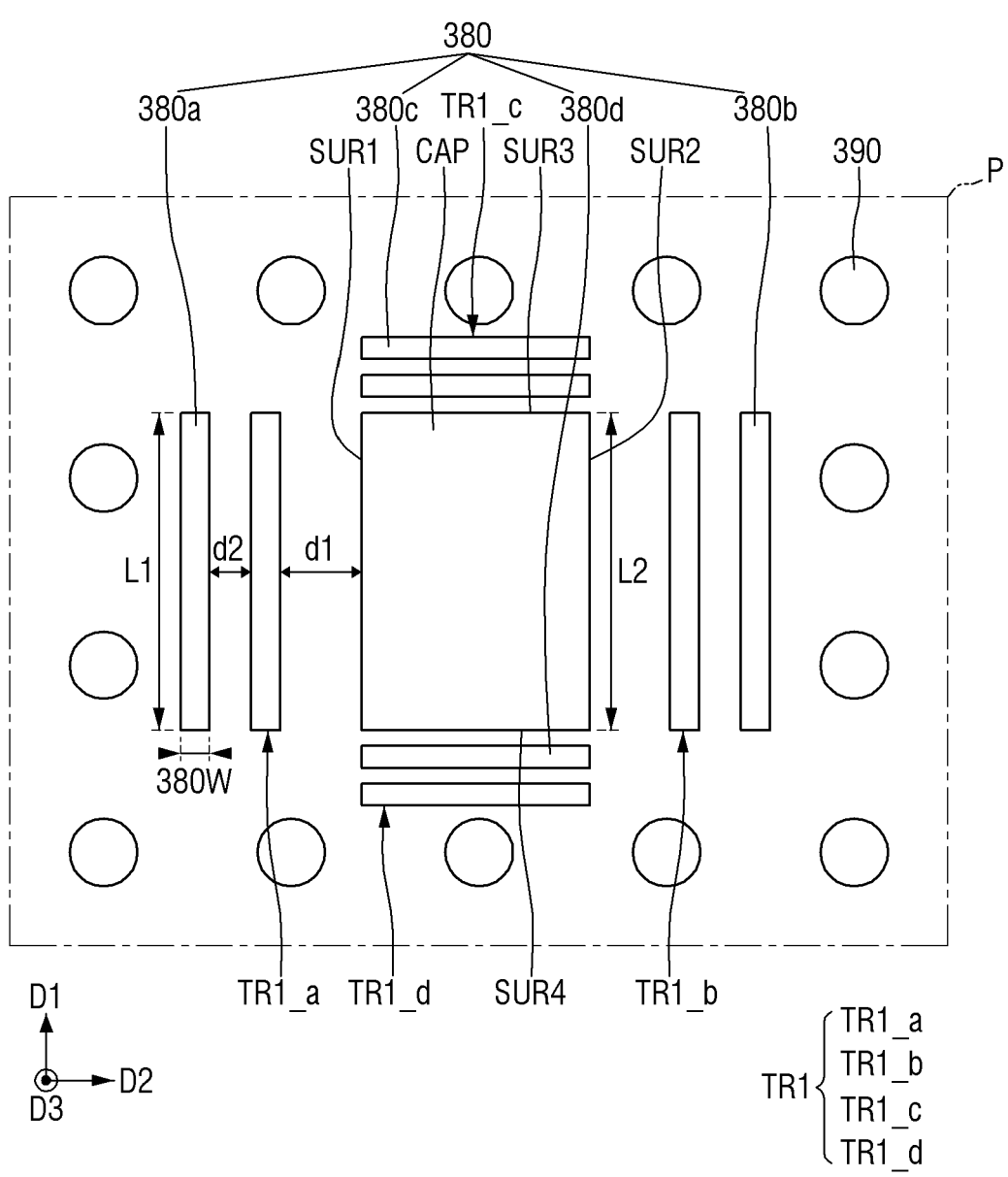

Referring to FIG. 8, the metal line 380 may include a first portion 380a, a second portion 380b, a third portion 380c, and a fourth portion 380d.

The first portion 380a of the metal line 380 may be provided adjacent to the first surface SUR1 of the capacitor CAP. The second portion 380b of the metal line 380 may be provided adjacent to the second surface SUR2 of the capacitor CAP. The first portion 380a of the metal line 380 and the second portion 380b of the metal line 380 may be symmetrical to each other relative to the center of the capacitor CAP. The third portion 380c of the metal line 380 may be provided adjacent to the third surface SUR3 of the capacitor CAP. The fourth portion 380d of the metal line 380 may be provided adjacent to the fourth surface SUR4 of the capacitor CAP. The third portion 380c of the metal line 380 and the fourth portion 380d of the metal line 380 may be symmetrical with each other relative to the center of the capacitor CAP.

In some embodiments, the first trench TR1 may include a first portion TR1_a, a second portion TR1_b, a third portion TR1_c, and a fourth portion TR1_d. The first portion TR1_a of the first trench TR1 may be formed adjacent to the first surface SUR1 of the capacitor CAP. The second portion TR1_b of the first trench TR1 may be formed adjacent to the second surface SUR2 of the capacitor CAP. The third portion TR1_c of the first trench TR1 may be formed adjacent to the third surface SUR3 of the capacitor CAP. The fourth portion TR1_d of the first trench TR1 may be formed adjacent to the fourth surface SUR4 of the capacitor CAP. A first portion 380a of the metal line 380 may be disposed inside the first portion TR1_a of the first trench TR1. A second portion 380b of the metal line 380 may be disposed inside the second portion TR1_b of the first trench TR1. A third portion 380c of the metal line 380 may be disposed inside the third portion TR1_c of the first trench TR1. A fourth portion 380d of the metal line 380 may be disposed inside the fourth portion TR1_d of the first trench TR1.

Since the metal line 380 according to some embodiments includes the second portion 380b, it is possible to more effectively control the flow of the underfill 395 from the second surface SUR2 of the capacitor CAP toward the connecting terminal 390. Since the metal line 380 includes the third portion 380c, it is possible to more effectively control the flow of the underfill 395 from the third surface SUR3 of the capacitor CAP toward the connecting terminal 390. Since the metal line 380 includes the fourth portion 380d, it is possible to more effectively control the flow of the underfill 395 from the fourth surface SUR4 of the capacitor CAP toward the connecting terminal 390.

Referring to FIGS. 9 to 13, the metal line 380 may not have an "I" shape when viewed in plan view.

Figure 9:
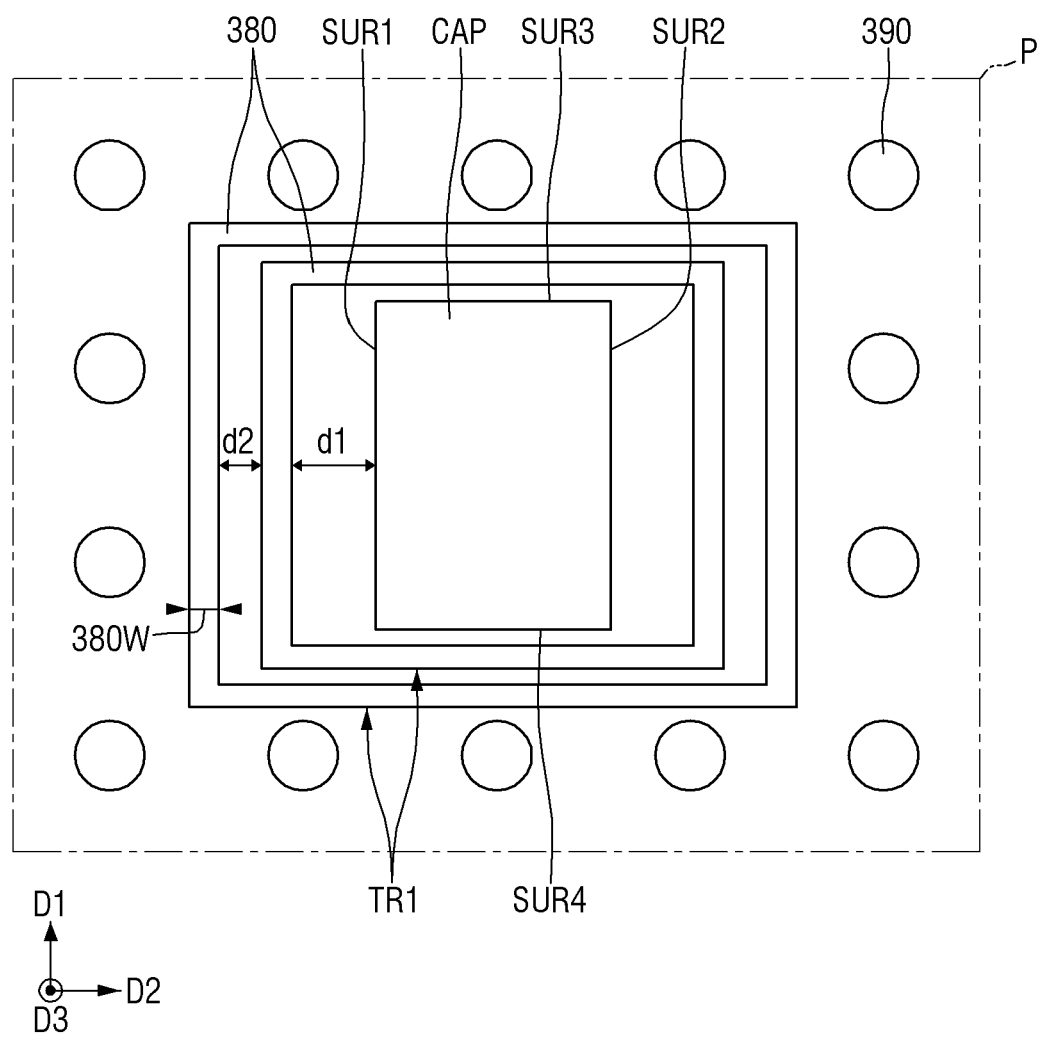

First, referring to FIG. 9, the metal line 380 may wrap (i.e., extend around the periphery of) the capacitor CAP when viewed in plan view.

For example, the metal line 380 may be a closed curve when viewed in plan view. The closed curve may have, but is not limited to, a rectangular shape. The metal line 380 includes a first sub-line and a second sub-line having a rectangular closed curve. A spaced distance d1 from the capacitor CAP to the metal line 380 may be 100 μm or more and 1000 μm or less. A spaced distance d2 between the first sub-line and the second sub-line of the metal line 380 may be at least 10 μm or more. The width 380W of the metal line 380 may be at least 30 μm or more. However, the technical idea of the present disclosure is not limited thereto.

In some embodiments, the first trench TR1 does not extend only in the first direction D1. The first trench TR1 may also be a closed curve when viewed in plan view. The closed curve may have, but not limited to, a rectangular shape.

Figure 10:
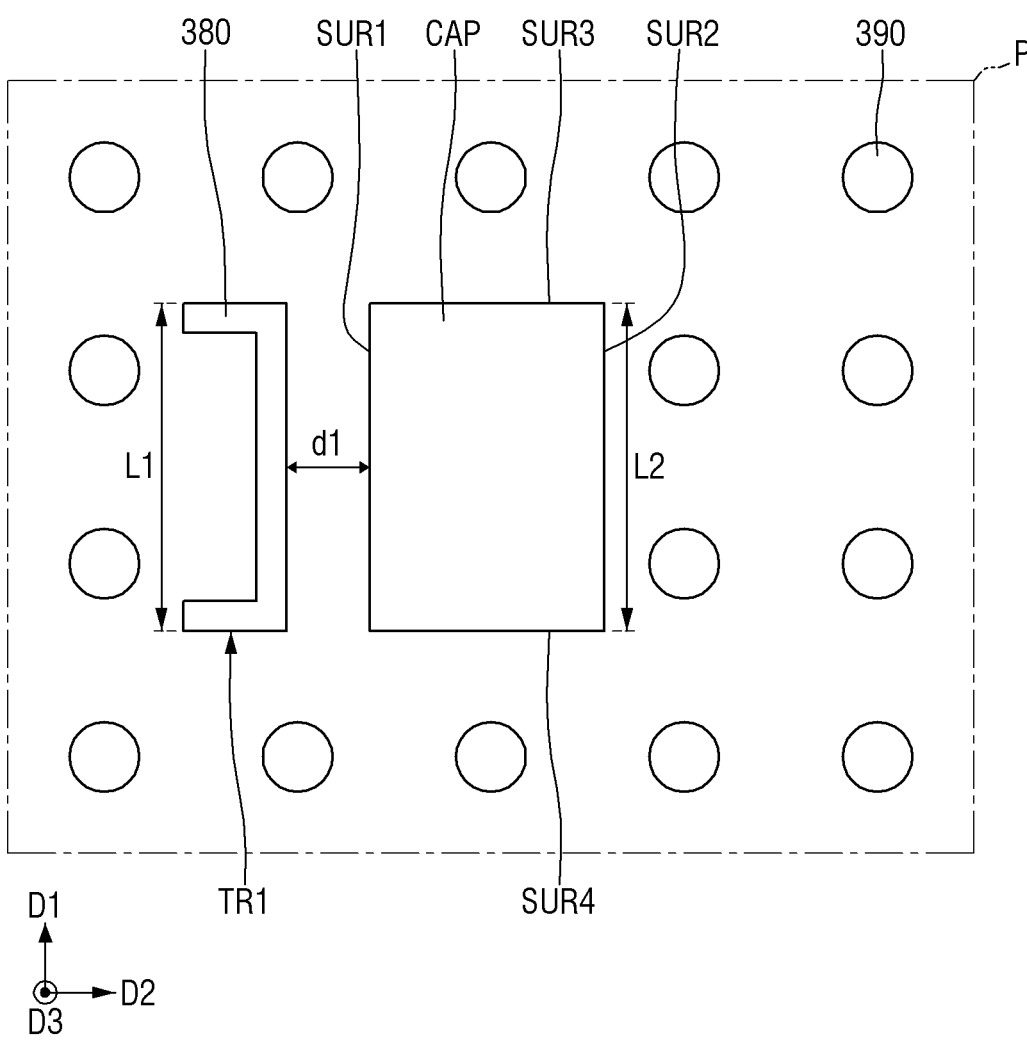

Referring to FIG. 10, the shape of the metal line 380 may be a "U" shape when viewed in plan view. The shape of the metal line 380 may be a "U" shape rotated counterclockwise by 90° when viewed in plan view. The shape of first trench TR1 may be a "U" shape when viewed in plan view. The shape of first trench TR1 may be a "U" shape rotated counterclockwise by 90° when viewed in plan view.

The spaced distance d1 from the first surface SUR1 of the capacitor CAP to the metal line 380 may be 100 μm or more and 1000 μm or less. A length L1 of the metal line 380 in the first direction D1 may be the same as a length L2 of the capacitor CAP in the first direction D1.

Although FIG. 10 shows only an example in which the shape of the metal line 380 and the shape of the first trench TR1 are a "U" shape rotated counterclockwise by 90°, the shape of the metal line 380 and the shape of the first trench TR1 may also be a "U" shape rotated clockwise by 90°, i.e., the illustrated "U" shape may be rotated 180° from the illustrated position.

Figure 11:
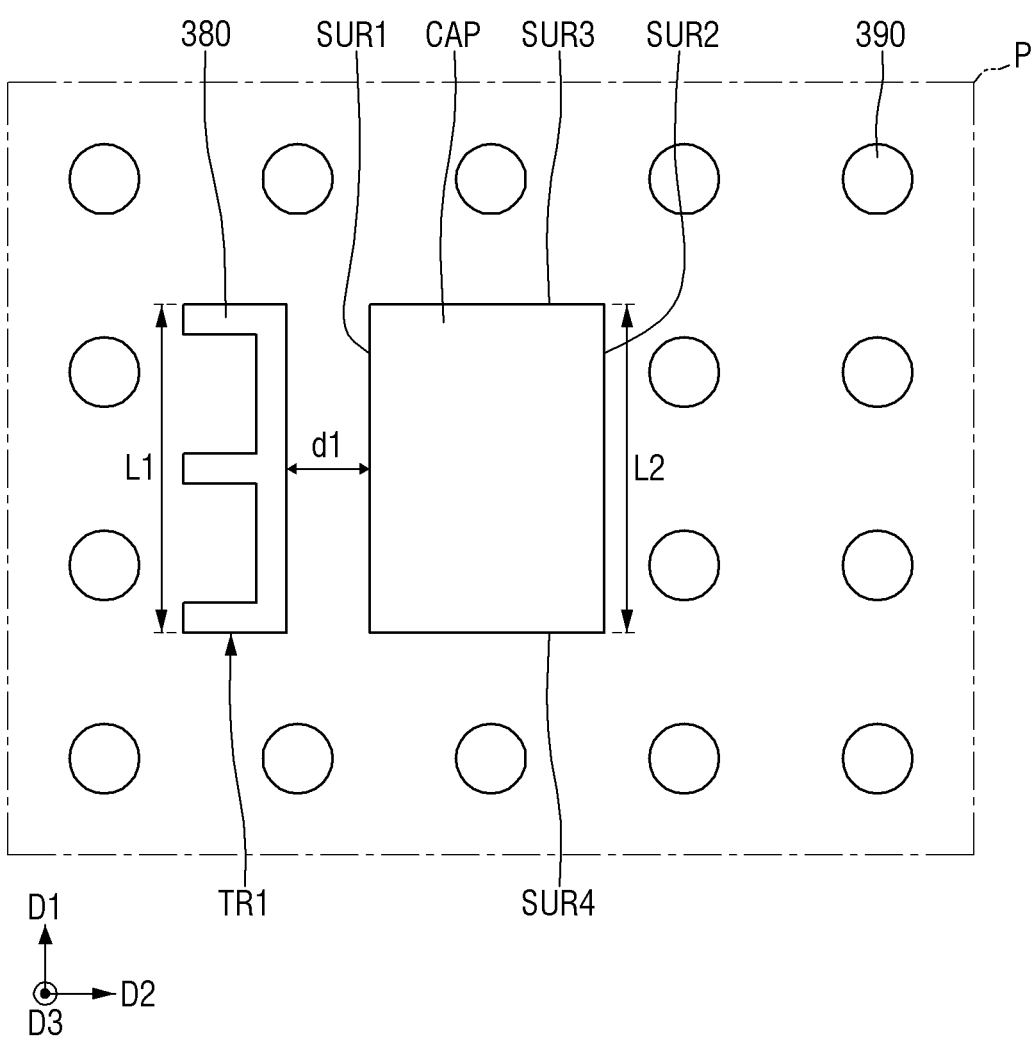

Referring to FIG. 11, the shape of the metal line 380 may be an "E" shape when viewed in plan view. The shape of the metal wire 380 may be an "E" shape rotated by 180° when viewed in plan view. The shape of first trench TR1 may be an "E" shape when viewed in plan view. The shape of first trench TR1 may be an "E" shape rotated by 180° when viewed in plan view.

Also in this case, the spaced distance d1 from the first surface SUR1 of the capacitor CAP to the metal line 380 may be 100 μm or more and 1000 μm or less. A length L1 of the metal line 380 in the first direction D1 may be the same as a length L2 of the capacitor CAP in the first direction D1.

Figure 12:
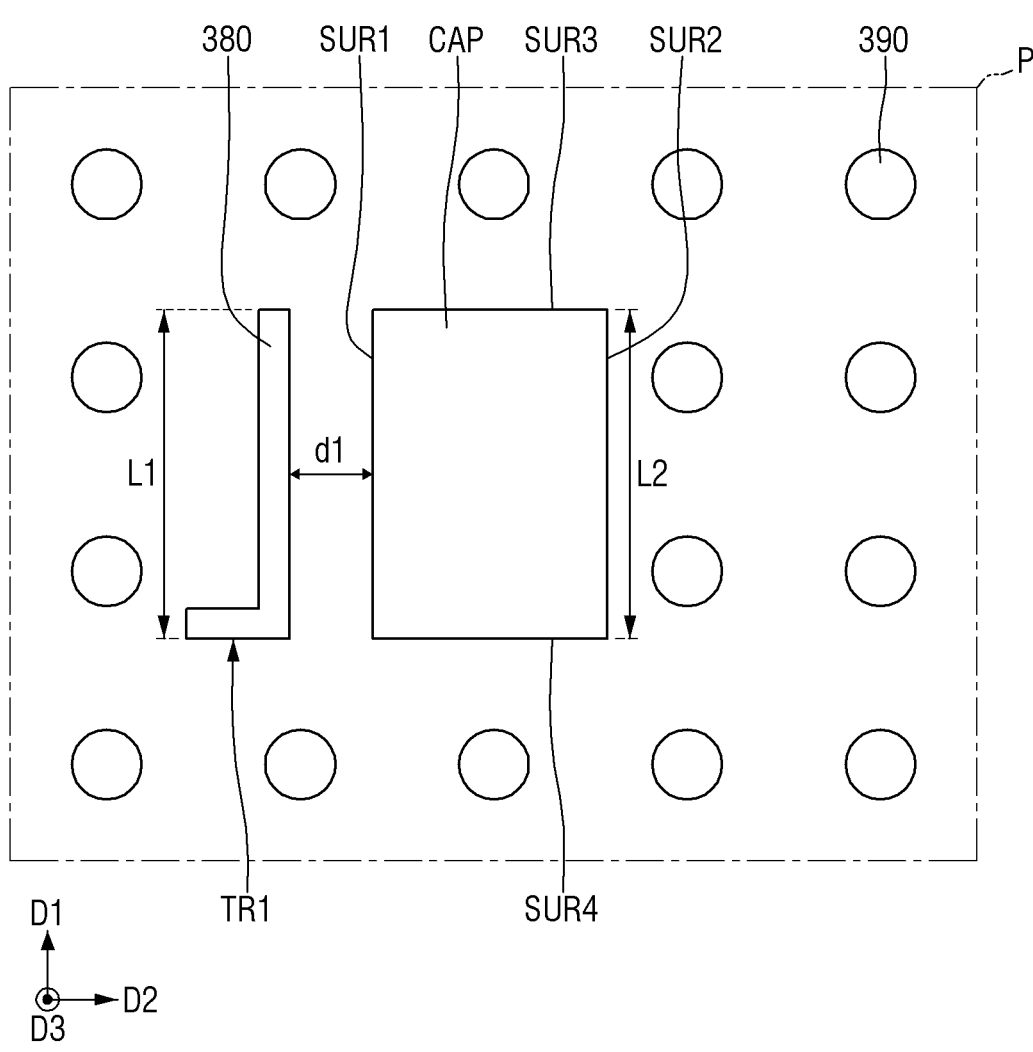

Referring to FIG. 12, the shape of the metal line 380 may be an "L" shape when viewed in plan view. The shape of the metal line 380 may be an "L" shape symmetrical in the first direction D1 when viewed in plan view. The shape of first trench TR1 may be an "L" shape when viewed in plan view. The shape of first trench TR1 may be an "L" shape symmetrical in the first direction D1 when viewed in plan view.

The spaced distance d1 from the first surface SUR1 of the capacitor CAP to the metal line 380 may be 100 μm or more and 1000 μm or less. A length L1 of the metal line 380 in the first direction D1 may be the same as a length L2 of the capacitor CAP in the first direction D1.

Although FIG. 12 only shows an example in which the shape of the metal line 380 and the shape of the first trench TR1 are an "L" shape symmetrical in the first direction D1, the shape of the metal line 380 and the shape of the first trench TR1 may have an "L" shape symmetrical in the second direction D2.

Figure 13:
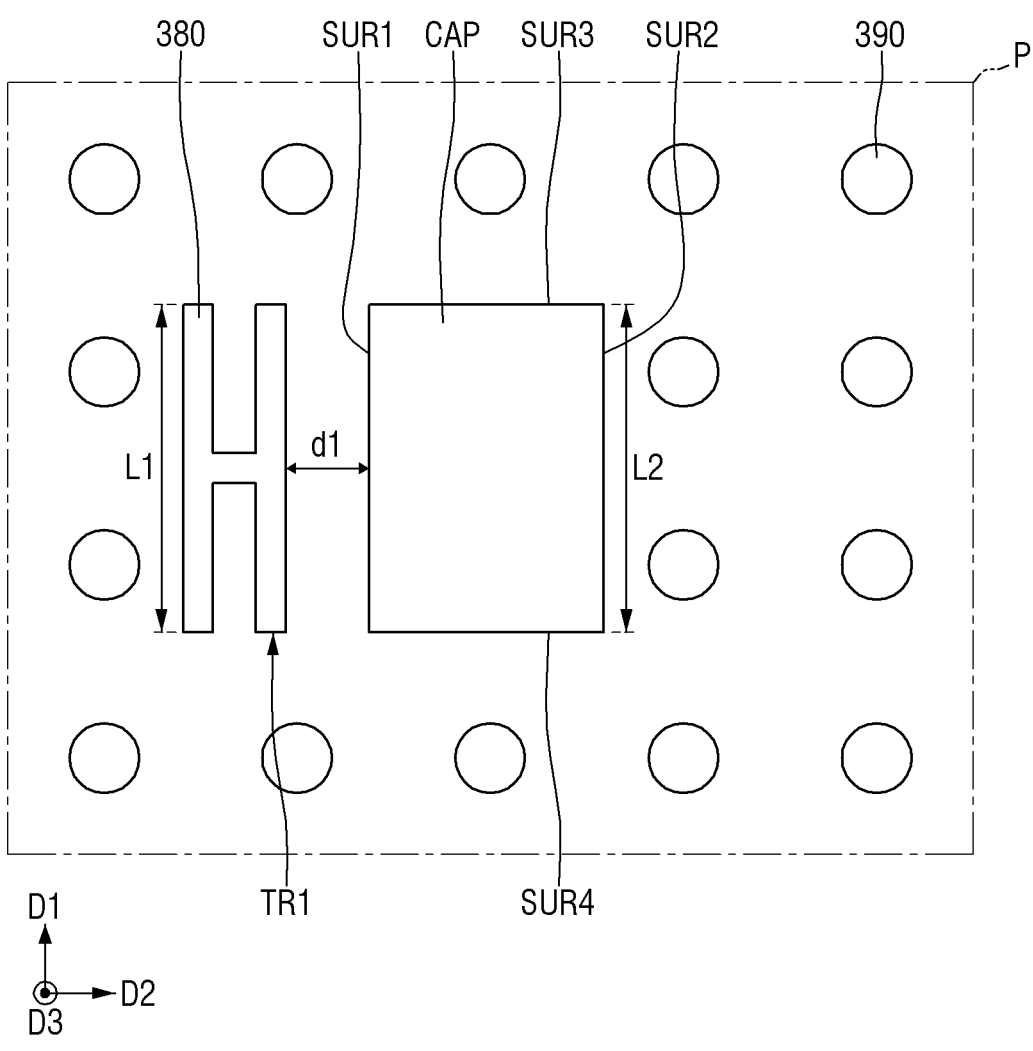

Referring to FIG. 13, the metal line 380 may have an "H" shape when viewed in plan view. The shape of first trench TR1 may be an "H" shape when viewed in plan view.

Also in this case, the spaced distance d1 from the first surface SUR1 of the capacitor CAP to the metal line 380 may be 100 μm or more and 1000 μm or less. A length L1 of the metal line 380 in the first direction D1 may be the same as a length L2 of the capacitor CAP in the first direction D1.

Figure 14:
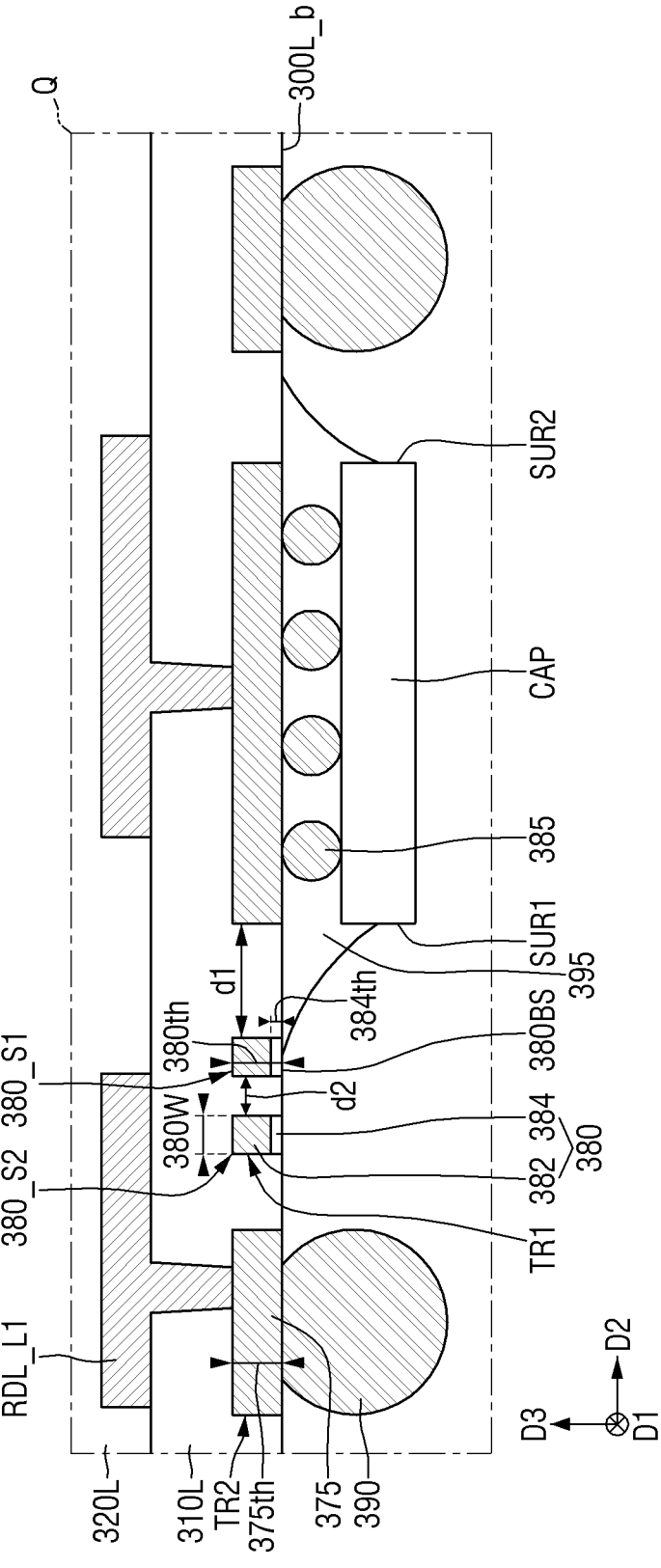
FIGS. 14 and 15 are exemplary cross-sectional views for explaining a semiconductor package according to some embodiments.
Figure 15:
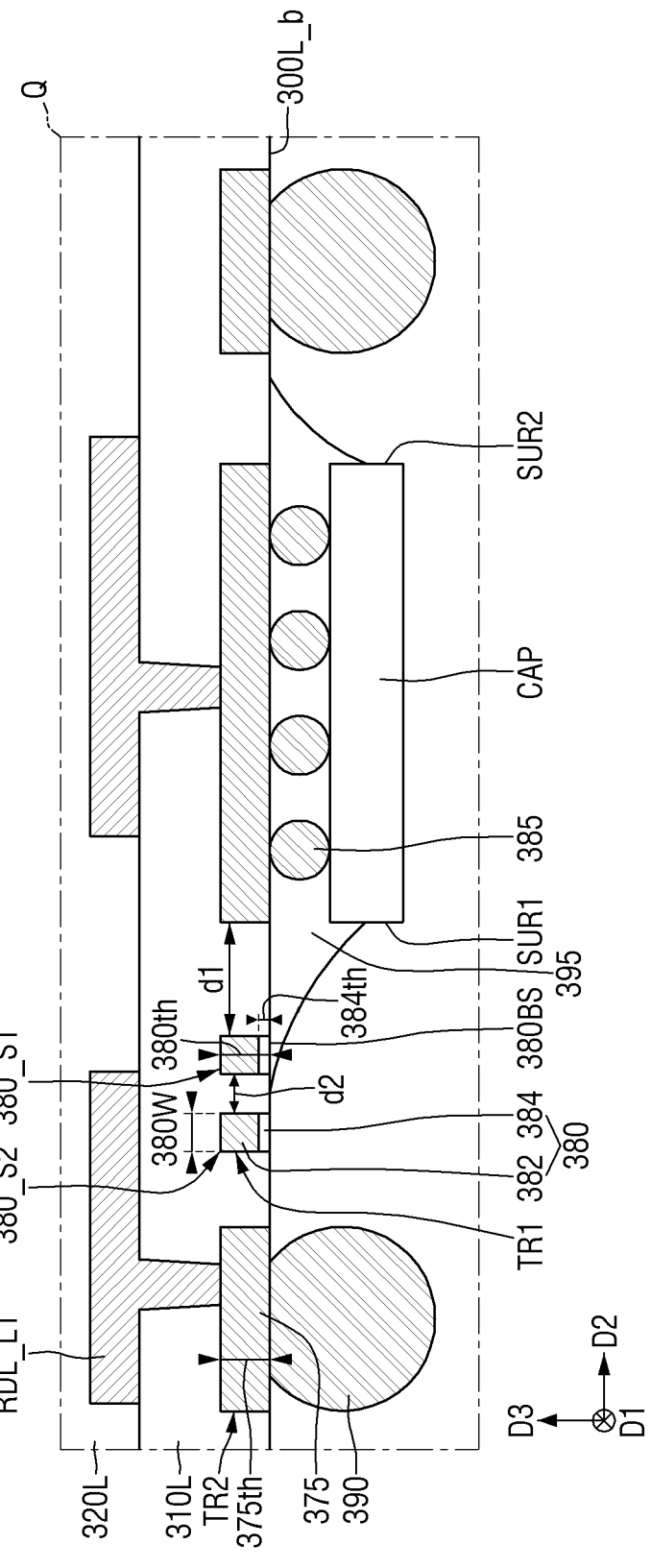

FIGS. 14 and 15 are exemplary cross-sectional views for explaining a semiconductor package according to some embodiments. Various embodiments of the semiconductor packages will be described below with reference to FIGS. 14 and 15.

First, referring to FIG. 14, at least a part of the underfill 395 may cover a part of the bottom surface 380BS of the metal line 380.

A part of the underfill 395 may overlap a part of the metal line 380 in the third direction D3. For example, a part of the underfill 395 may overlap a part of the first sub-line 380_S1 of the metal line 380 in the third direction D3, as illustrated.

An underfill 395 is discharged into the space between the metal line 380 and the first surface SUR1 of the capacitor CAP, and the underfill 395 may flow toward the metal line 380. Although the flow of the underfill 395 is controlled by the metal line 380, the flow of the underfill 395 may not be completely controlled by the metal line 380. In this case, a part of the underfill 395 may cover a part of the bottom surface 380BS of the metal line 380.

Referring to FIG. 15, at least a part of the underfill 395 may cover a part of the bottom surface 380BS of the metal line 380.

A part of the underfill 395 may overlap a part of the metal line 380 in the third direction D3. For example, a part of the underfill 395 may completely overlap the first sub-line 380_S1 of the metal line 380 in the third direction D3. The underfill 395 may not completely overlap the second sub-line 380_S2 of the metal line 380 in the third direction D3.

The underfill 395 is discharged into the space between metal line 380 and the first surface SUR1 of the capacitor CAP, and the underfill 395 may flow toward the metal line 380. Although the flow of the underfill 395 is controlled by the metal line 380, the flow of the underfill 395 may not be completely controlled by the metal line 380. In this case, the underfill 395 may flow over the first sub-line 380_S1. However, the underfill 395 may not flow over the second sub-line 380_S2.

Figure 16:
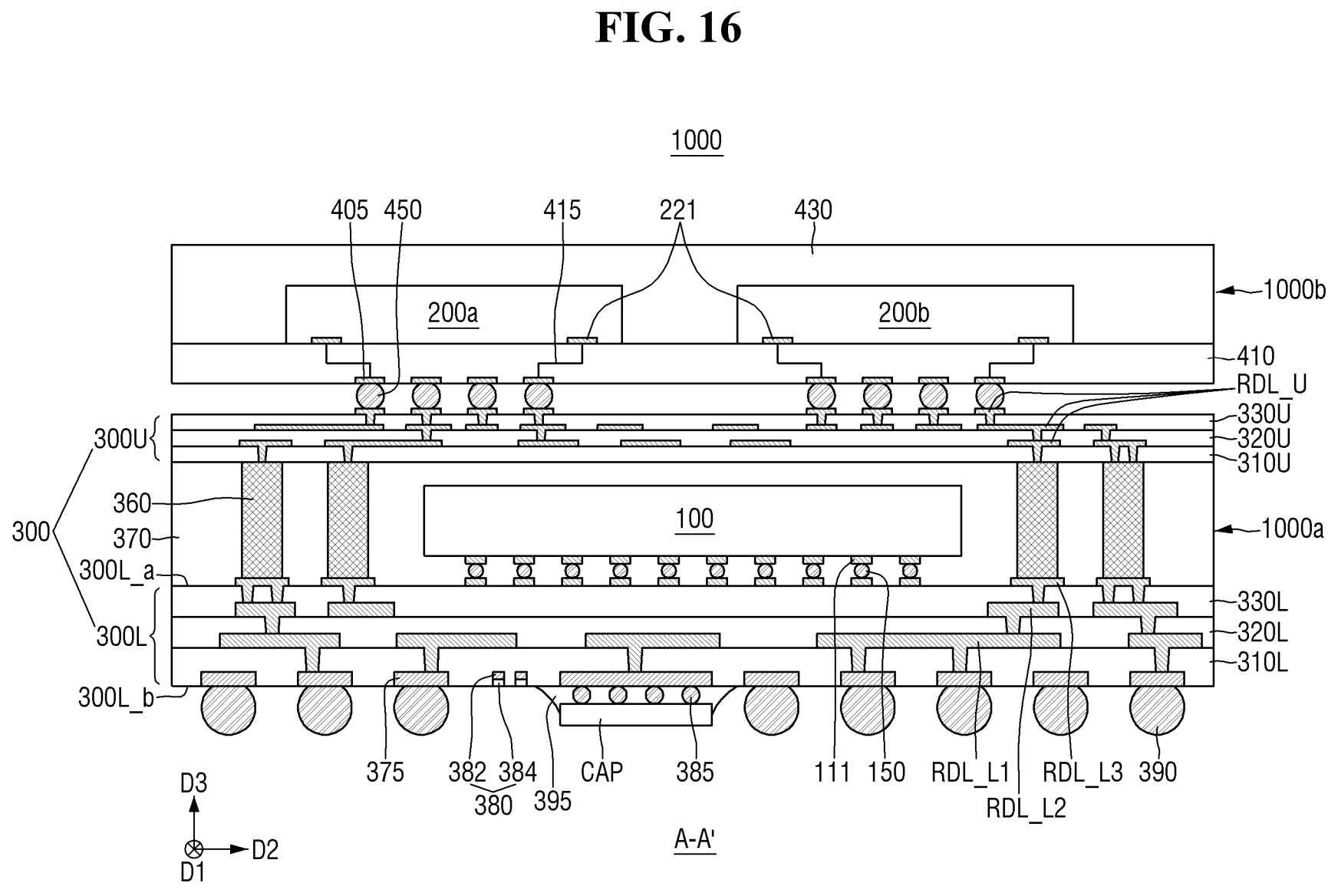
Figure 17:
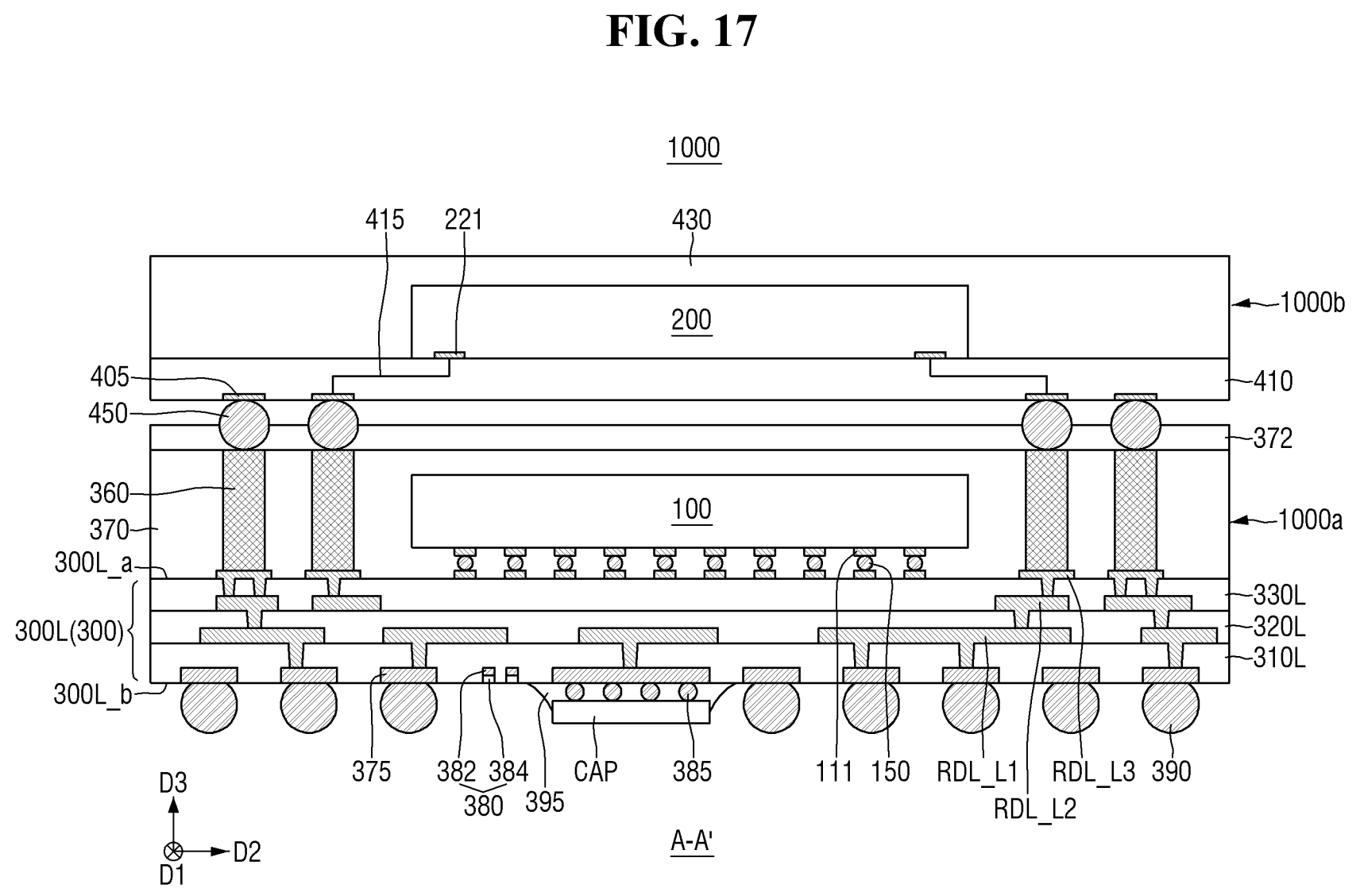

FIGS. 16 and 17 are exemplary cross-sectional views for explaining a semiconductor package according to some embodiments. Various embodiments of the semiconductor package will be described below with reference to FIGS. 16 and 17.

First, referring to FIG. 16, the second semiconductor package 1000b may include two second semiconductor chips 200a and 200b. That is, the second semiconductor chip may include a first sub-semiconductor chip 200a and a second sub-semiconductor chip 200b.

The first sub-semiconductor chip 200a and the second sub-semiconductor chip 200b may be spaced apart from each other. The first sub-semiconductor chip 200a and the second sub-semiconductor chip 200b may be separated from each other by an upper molding film 430. Each of the first sub-semiconductor chip 200a and the second sub-semiconductor chip 200b may include second chip pads 221 on the lower surfaces thereof. The second semiconductor package 1000b does not include the upper conductive pad 403. As an example, the second chip pads 221 may be electrically connected to the lower conductive pad 405 through the internal wirings 415 inside the circuit board 410.

Although FIG. 16 shows that the first and second sub-semiconductor chips 200a and 200b are provided on the upper surface of the circuit board 410 at the same level, the first sub-semiconductor chip 200a and the second sub-semiconductor chip 200b may be sequentially stacked on the upper surface of the circuit board 410.

Referring to FIG. 17, unlike the embodiment shown in FIG. 2, the upper package substrate may be omitted from the first semiconductor package 1000a.

More specifically, an upper insulating layer 372 may be provided on the molding film 370. The upper insulating layer 372 may include an insulating material. For example, the upper insulating layer 372 may include, but is not limited to, at least one of silicon oxide, silicon nitride, silicon oxynitride, and a low dielectric constant material having a dielectric constant lower than that of silicon oxide.

The third connection members 450 may be provided between the lower conductive pad 405 of the circuit board 410 and the metal pillars 360 of the first semiconductor package 1000a. A part of the third connecting members 450 may be disposed inside the upper insulating layer 372. One surface of the third connection members 450 may be connected to the lower conductive pad 405, and the other surface of the third connection members 450 may be connected to the metal pillars 360. Therefore, the first semiconductor package 1000a and the second semiconductor package 1000b may be electrically connected to each other.

The second semiconductor chip 200 may be disposed on the circuit board 410. The second chip pads 221 of the second semiconductor chip 200 may come into contact with the upper surface of the circuit board 410. The second chip pads 221 of the second semiconductor chip 200 may be electrically connected to the lower conductive pads 405 through the internal wiring 415 in the circuit board 410.

FIGS. 18 to 25 are diagrams for explaining the fabricating process of the semiconductor package having the cross section of FIG. 2. A method for fabricating a semiconductor package according to some embodiments will be described below with reference to FIGS. 18 to 25.

Figure 18:
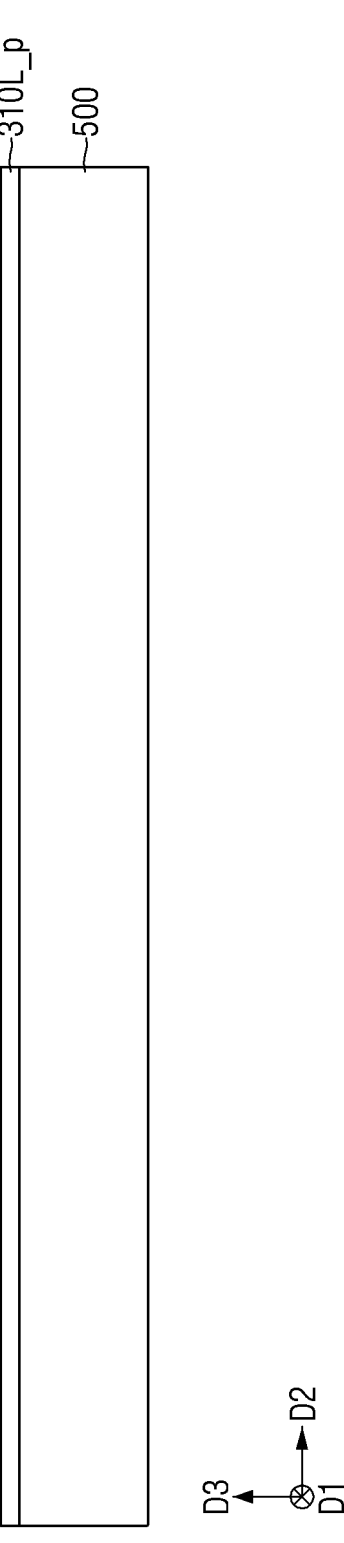

Referring to FIG. 18, a carrier substrate 500 may be provided. The carrier substrate 500 may include a glass. A pre-first lower insulating layer 310L_p may be formed on the carrier substrate 500.

The pre-first lower insulating layer 310L_p may be made of a photoimageable dielectric. The pre-first lower insulating layer 310L_p may include, for example, a photosensitive polymer. The photosensitive polymer may be formed of, for example, at least one of photosensitive polyimide, polybenzoxazole, phenolic polymer, and benzocyclobutene-based polymer.

Figure 19:
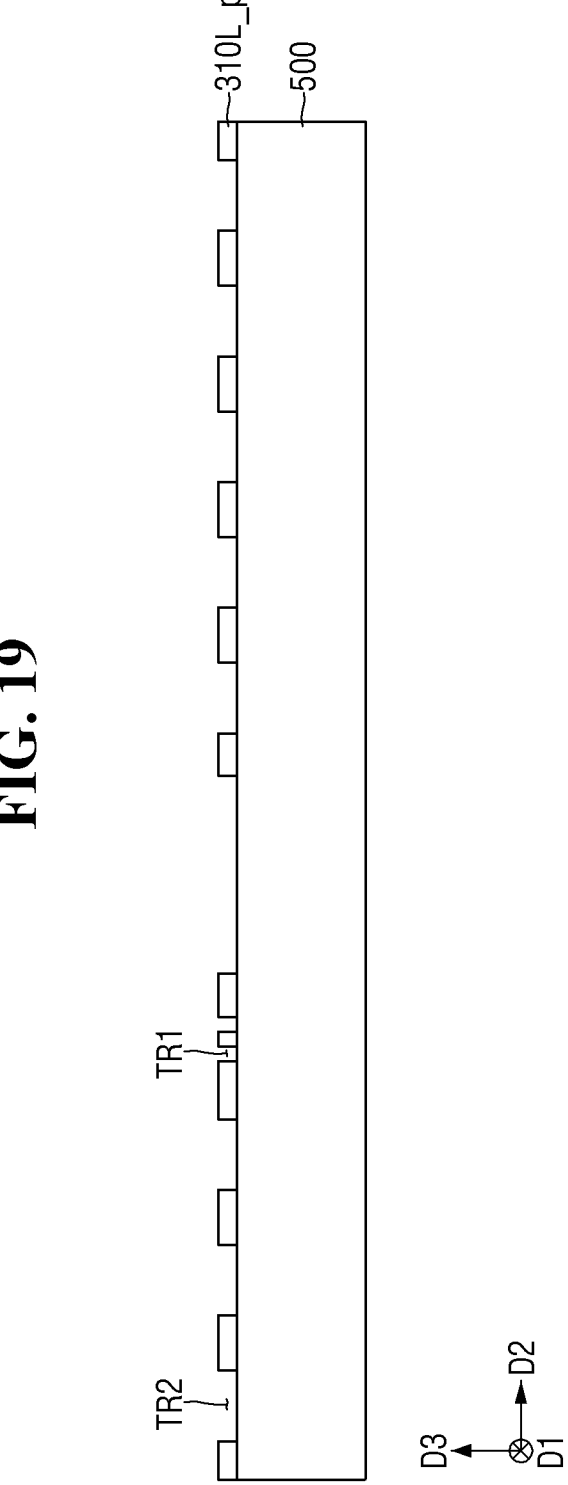

Referring to FIG. 19, a part of the pre-first lower insulating layer 310L_p may be etched.

First, although not shown, a mask film may be formed on the pre-first lower insulating layer 310L_p. The mask film may have an opening that approximately defines the positions of the pad pattern (375 of FIG. 2) and the metal line (380 of FIG. 2). The mask film may be formed of a photoresist film, ACL (Amorphous Carbon Layer), SOH (Spin on Hardmask) or SOC (Spin on Carbon).

A part of the pre-first lower insulating layer 310L_p may be etched, using the mask film as an etch mask. A part of the pre-first lower insulating layer 310L_p may be etched to form the first trench TR1 and the second trench TR2. The width of the first trench TR1 may be smaller than the width of the second trench TR2, but is not limited thereto. The first trench TR1 and the second trench TR2 may be formed by the same process. Therefore, the depth of first trench TR1 and the depth of second trench TR2 may be the same as each other.

Figure 20:
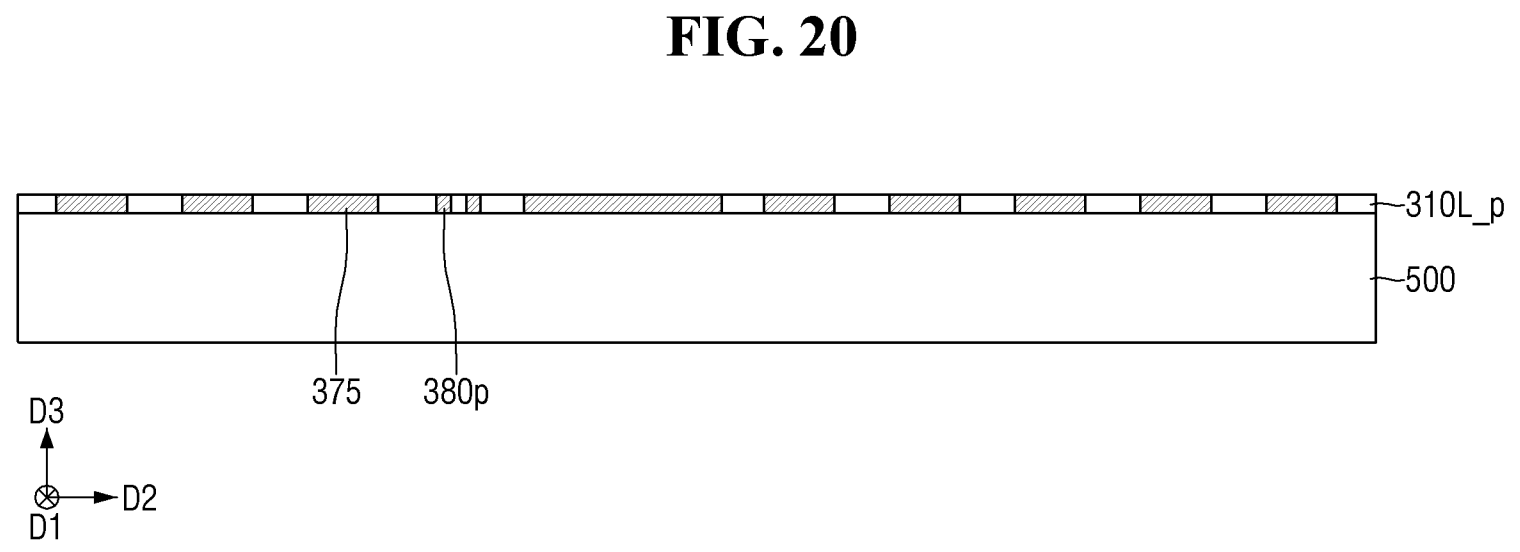

Referring to FIG. 20, pad patterns 375 and pre-metal lines 380p may be formed. The pad patterns 375 may be formed inside the second trench TR2. The pre-metal lines 380p may be formed inside the first trench TR1. The pad patterns 375 and the pre-metal lines 380p may each include a conductive material. As an example, the pad patterns 375 and the pre-metal lines 380p may each include copper (Cu).

Although not shown, a pre-metal layer that fills the first trench TR1 and the second trench TR2 and covers the pre-first lower insulating layer 310L_p may be formed. The pre-metal layer includes copper. The pre-metal layer is then etched to expose the upper surface of the pre-first lower insulating layer 310L_p. The pre-metal layer is etched to form the pad patterns 375 and the pre-metal lines 380p.

Figure 21:
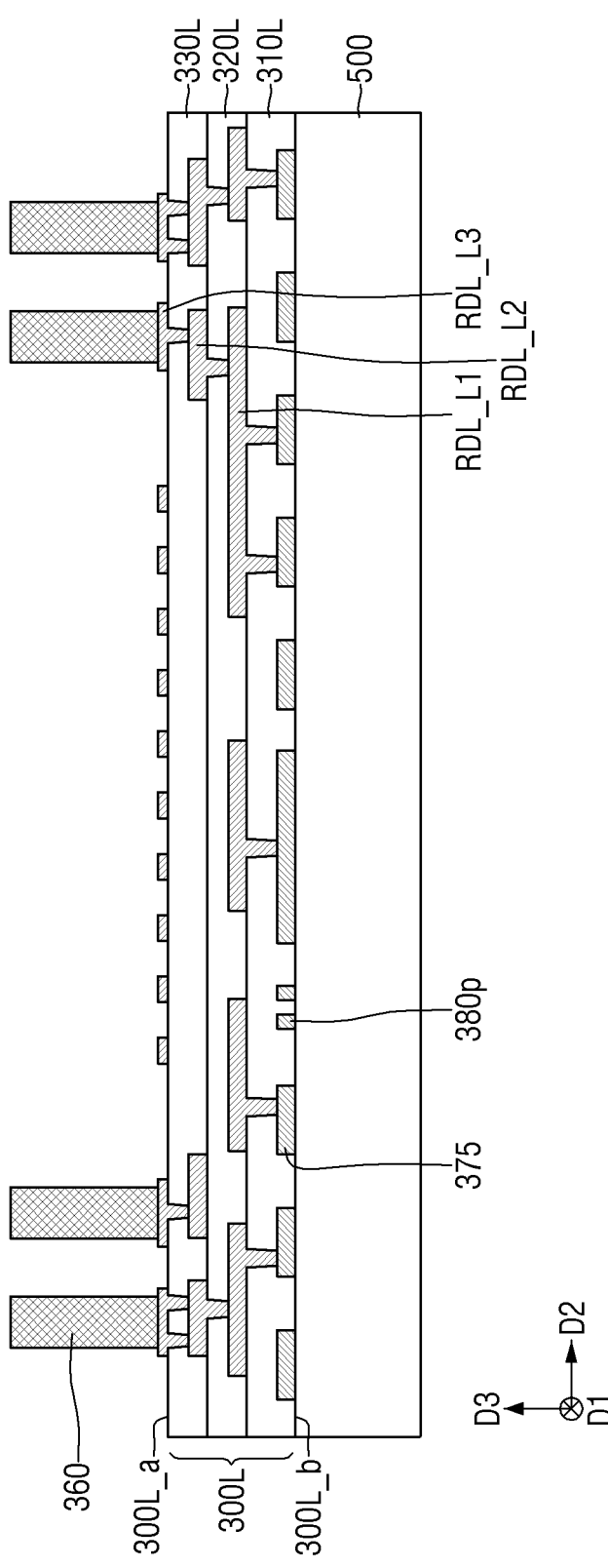

Referring to FIG. 21, a lower package substrate 300L, including first to third lower redistribution patterns RDL_L1, RDL_L2, and RDL_L3, and metal pillars 360 may be formed.

First, a first lower insulating layer 310L may be formed. A via portion of the first lower redistribution pattern RDL_L1 may be formed in the first lower insulating layer 310L. Subsequently, a second lower insulating layer 320L may be formed. A wiring portion of the first lower redistribution pattern RDL_L1 and a via portion of the second lower redistribution pattern RDL_L2 may be formed in the second lower insulating layer 320L. Subsequently, a third lower insulating layer 330L may be formed. A wiring portion of the second lower redistribution pattern RDL_L2 and a via portion of the third lower redistribution pattern RDL_L3 may be formed in the third lower insulating layer 330L. A wiring portion of the third lower redistribution pattern RDL_L3 may be formed on the third lower insulating layer 330L.

The lower package substrate 300L includes first to third lower insulating layers 310L, 320L and 330L. The lower package substrate 300L includes a front side 300L_a and a rear side 300L_b that are opposite to each other. The front side 300L_a of the lower package substrate 300L may be the upper surface of the third lower insulating layer 330L. The rear side 300L_b of the lower package substrate 300L may be the lower surface of the first lower insulating layer 310L.

Metal pillars 360 may be formed on the front side 300L_a of the lower package substrate 300L.

Figure 22:
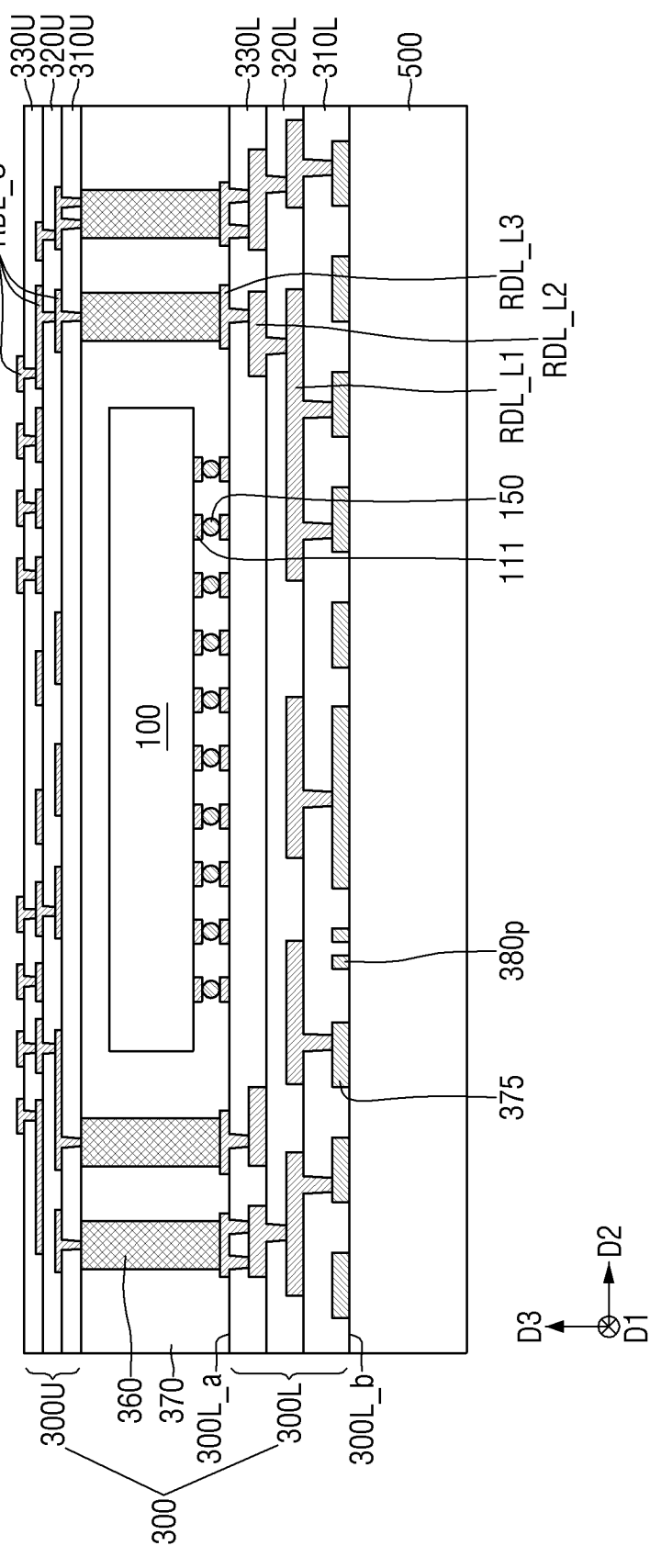

Referring to FIG. 22, the first semiconductor chip 100 may be mounted on the front side 300L_a of the lower package substrate 300L. First, the second connection members 150 may land on the third lower redistribution patterns RDL_L3. Subsequently, the first semiconductor chip 100 may be mounted on the second connection members 150. The first chip pads 111 may be connected with the second connection members 150.

A molding film 370 may then be formed. The molding film 370 may cover the first semiconductor chip 100 and the metal pillars 360.

An upper package substrate 300U may be formed on the molding film 370. The upper package substrate 300U may include first to third upper insulating layers 310U, 320U and 330U, and upper redistribution patterns RDL_U inside the first to third upper insulating layers 310U, 320U and 330U.

Figure 23:
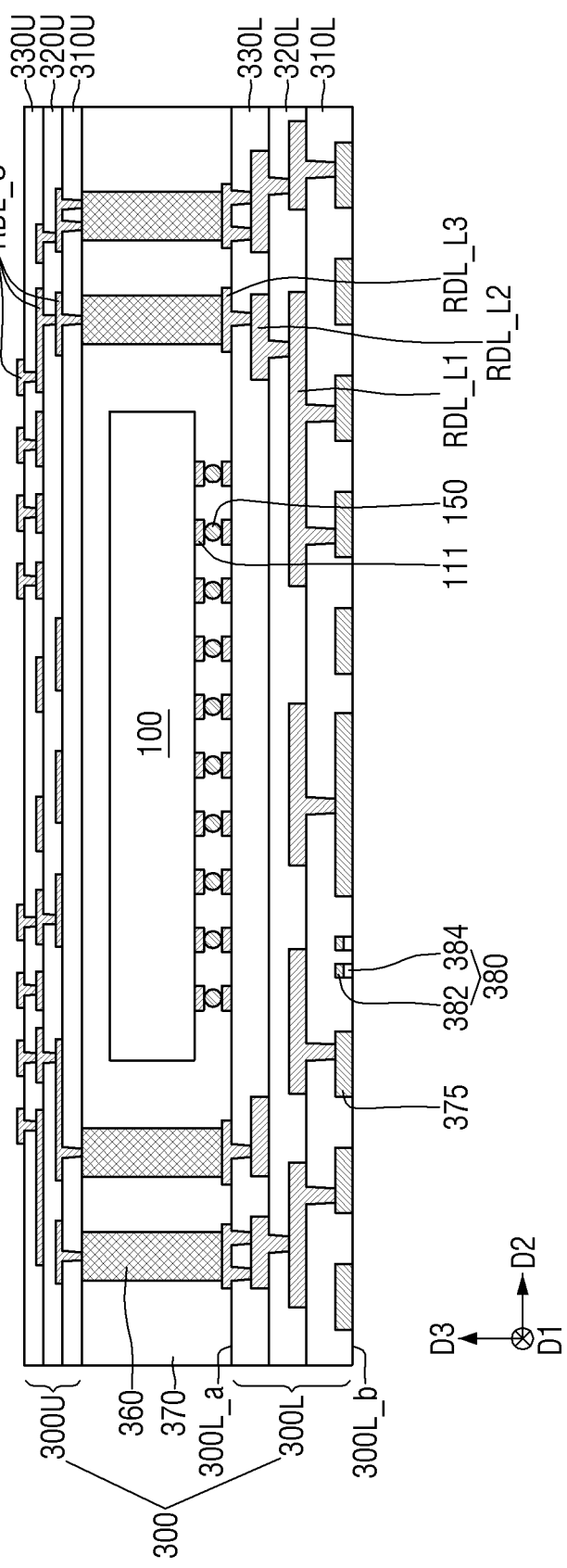

Referring to FIG. 23, the carrier substrate 500 may be removed. The carrier substrate 500 is removed to expose the rear side 300L_b of the lower package substrate 300L. While the rear side 300L_b of the lower package substrate 300L is exposed, the surface of the pre-metal line 380p is exposed. Accordingly, a part of the pre-metal line 380p may be oxidized. A part of the pre-metal line 380p may be oxidized to form a metal line 380.

The metal line 380 includes a metal film 382 and a metal oxide film 384. As an example, the metal film 382 includes copper (Cu), and the metal oxide film 384 includes copper oxide (CuO). The thickness of the metal oxide film 384 in the third direction D3 may be, but is not limited to, 1000 Å or more.

Figure 24:
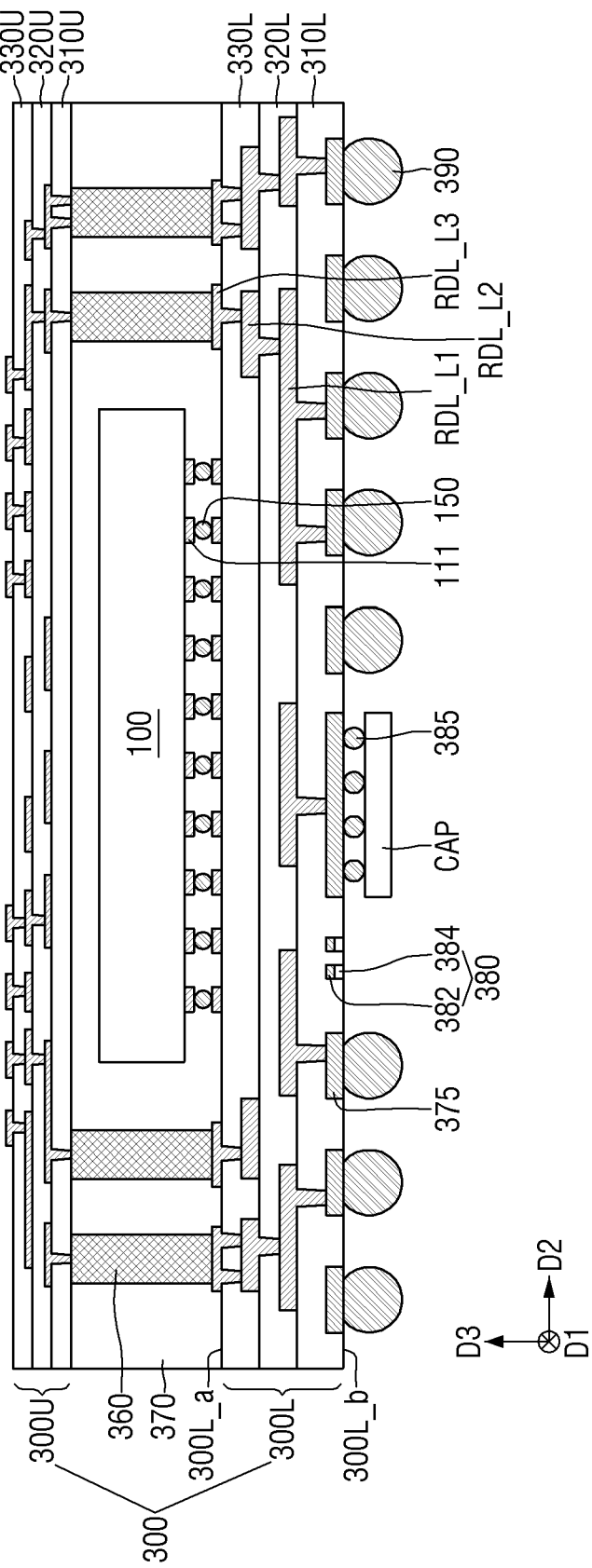

Referring to FIG. 24, a plurality of connecting terminals 390 and a plurality of first connection members 385 may be formed on the rear side 300L_b of the lower package substrate 300L. The connecting terminals 390 and the plurality of first connection members 385 may be connected to the pad pattern 375. The capacitor CAP may be mounted on the first connection member 385.

Figure 25:
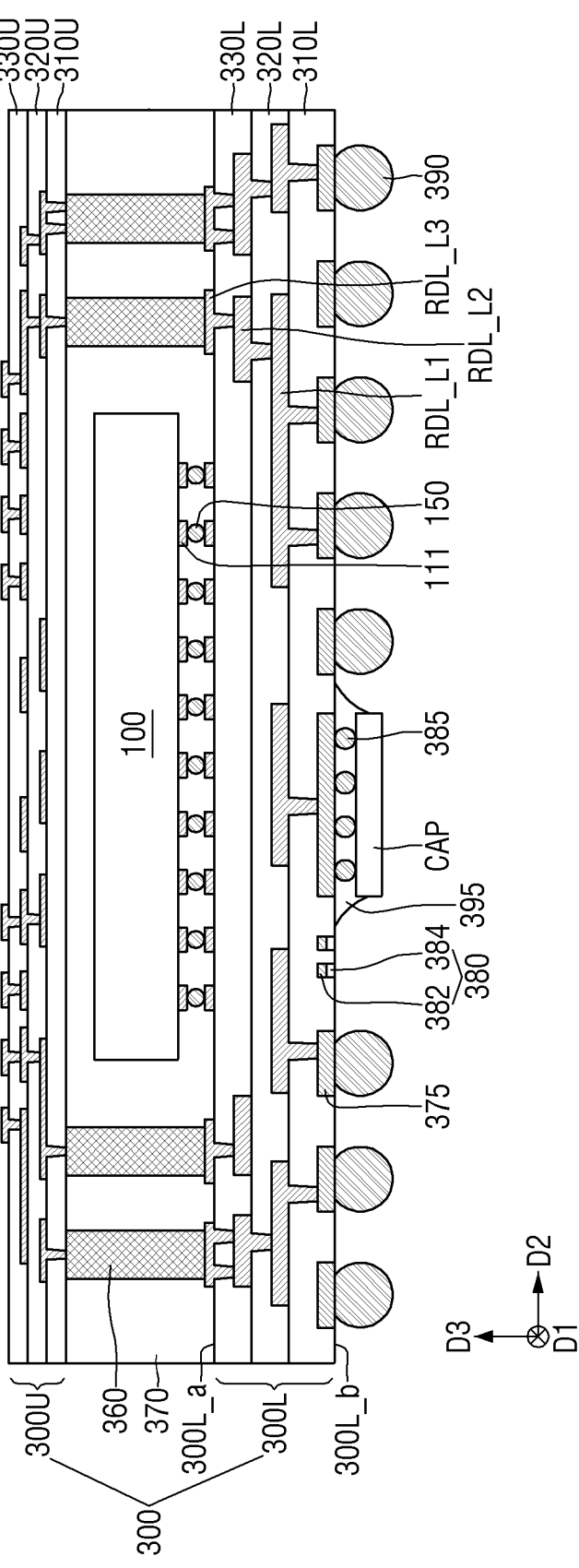

Referring to FIG. 25, the underfill 395 may be discharged. The underfill 395 may be discharged into the space between the capacitor CAP and the metal line 380. The underfill 395 may be discharged to the rear side 300L_b of the lower package substrate 300L and flow into the space between the capacitor CAP and the lower package substrate 300L. The underfill 395 may fill the space between the capacitor CAP and the lower package substrate 300L.

The underfill 395 does not flow over the metal line 380. The underfill 395 does not flow over the metal line 380 due to a difference in physical properties between the metal line 380 and the lower package substrate 300L. Accordingly, it is possible to prevent the connecting terminals 390 from being contaminated with the underfill 395.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor package comprising:
   a package substrate comprising a first side and an opposite second side spaced from the first side in a thickness direction;
   a semiconductor chip on the first side of the package substrate;
   a capacitor on the second side of the package substrate;
   a plurality of connecting terminals on the second side of the package substrate; and a metal line within a trench in the package substrate, wherein the trench extends a length in a first direction transverse to the thickness direction and extends a depth in the thickness direction, the length greater than the depth, wherein the metal line is between the capacitor and the plurality of connecting terminals, wherein the metal line is spaced apart from the capacitor in a second direction that is transverse to the first direction, and wherein a distance between the metal line and the capacitor is 100 μm or more and 1000 μm or less.

2. The semiconductor package of claim 1, wherein the metal line comprises a first sub-line and a second sub-line, wherein the first sub-line and the second sub-line each extend in the first direction, and wherein the first sub-line and the second sub-line are spaced apart from each other in the second direction.

3. The semiconductor package of claim 2, wherein a distance between the first sub-line and the second sub-line is at least 10 μm or more.

4. The semiconductor package of claim 1, wherein a width of the metal line in the second direction is at least 30 μm or more.

5. The semiconductor package of claim 1, wherein the metal line comprises a metal film and a metal oxide film on the metal film.

6. The semiconductor package of claim 5, wherein the metal film comprises copper (Cu), and the metal oxide film comprises copper oxide (CuO).

7. The semiconductor package of claim 5, wherein the metal oxide film has a thickness of 1000 Å or more.

8. The semiconductor package of claim 1, wherein a bottom surface of the metal line and the second side of the package substrate are co-planar.

9. The semiconductor package of claim 1, further comprising:

a plurality of pad patterns on the second side of the package substrate, wherein each of the plurality of pad patterns is connected to a respective one of the plurality of connecting terminals, wherein a thickness of each of the plurality of pad patterns is the same as a depth of the trench.

10. The semiconductor package of claim 1, wherein the plurality of connecting terminals comprise a first set of the plurality of connecting terminals adjacent a first surface of the capacitor and a second set of the plurality of connecting terminals adjacent an opposite second surface of the capacitor, wherein the metal line comprises a first portion between the first surface of the capacitor and the first set of the plurality of connecting terminals, and a second portion between the second surface of the capacitor and the second set of the plurality of connecting terminals.

11. The semiconductor package of claim 1, wherein a length of the trench extends in the first direction is the same as a length of the capacitor in the first direction.

12. A semiconductor package comprising:

a package substrate comprising a first side and an opposite second side;

a semiconductor chip on the first side of the package substrate;

a capacitor on the second side of the package substrate, wherein the capacitor has a rectangular shape in plan view;

an underfill between the capacitor and the package substrate;

a plurality of connecting terminals on the second side of the package substrate; and a plurality of metal lines within the package substrate, wherein the plurality of metal lines are in adjacent, spaced apart relationship and are between a first surface of the capacitor and the plurality of connecting terminals, wherein each of the plurality of metal lines has an elongate rectangular shape in plan view.

13. The semiconductor package of claim 12, wherein the plurality of metal lines comprise a first sub-line, a second sub-line, and a third sub-line, wherein the first sub-line and the second sub-line are spaced apart from each other by 10 μm or more, and wherein the second sub-line and the third sub-line are spaced apart from each other by 10 μm or more, wherein the underfill overlaps at least a part of the first sub-line and the second sub-line, and wherein the underfill does not overlap the third sub-line.

14. The semiconductor package of claim 12, wherein bottom surfaces of the plurality of metal lines and the second side of the package substrate are co-planar.

15. The semiconductor package of claim 12, further comprising:

a plurality of pad patterns on the second side of the package substrate, wherein each of the plurality of pad patterns is connected to a respective one of the plurality of connecting terminals, wherein a thickness of each of the plurality of pad patterns is the same as a thickness of at least one of the plurality of metal lines.

16. The semiconductor package of claim 12, wherein each of the plurality of metal lines comprises a metal film and a metal oxide film on the metal film.

17. The semiconductor package of claim 16, wherein the metal oxide film has a thickness of 1000 Å or more.

18. The semiconductor package of claim 12, wherein each of the plurality of metal lines has a width of at least 30 μm or more.

19. A semiconductor package comprising:

a package substrate comprising a first side and an opposite second side;

a plurality of pad patterns on the second side of the package substrate;

a semiconductor chip on the first side of the package substrate;

a capacitor on the second side of the package substrate, wherein the capacitor has a rectangular shape in plan view;

an underfill between the capacitor and the package substrate;

a plurality of connecting terminals on the second side of the package substrate, wherein each of the plurality of pad patterns is connected to a respective one of the plurality of connecting terminals; and a metal line within a trench in the package substrate, wherein the trench extends in a first direction, and wherein the metal line comprises a metal film and a metal oxide film on the metal film, wherein the trench is between a first surface of the capacitor and the plurality of connecting terminals, wherein the metal line comprises a first sub-line and a second sub-line spaced apart from each other in a second direction transverse to the first direction, wherein the underfill overlaps at least a part of the first sub-line, and does not overlap the second sub-line, wherein a bottom surface of the metal line and the second side of the package substrate are co-planar, and wherein a thickness of each of the plurality of pad patterns is the same as a thickness of the metal line.

20. The semiconductor package of claim 19, wherein the metal line has a width of at least 30 μm or more in the second direction, and wherein the first sub-line and the second sub-line are spaced apart by at least 10 μm or more.

\* \* \* \* \*